United States Patent [19]

Van Auken et al.

[11] Patent Number: 5,638,072

[45] Date of Patent: Jun. 10, 1997

[54] MULTIPLE CHANNEL ANALOG TO DIGITAL CONVERTER

[75] Inventors: Jeffrey B. Van Auken, Littleton; Joseph L. Sousa, Lawrence, both of Mass.

[73] Assignee: Sipex Corporation, Billerica, Mass.

[21] Appl. No.: 350,645

[22] Filed: Dec. 7, 1994

[51] Int. Cl.$^6$ ................................................. H03M 1/00
[52] U.S. Cl. ............................ 341/141; 341/165; 341/172
[58] Field of Search ................................. 341/141, 155, 341/158, 161, 164, 165, 172

[56] References Cited

U.S. PATENT DOCUMENTS

| | | | |
|---|---|---|---|
| 3,582,942 | 6/1971 | Carter, Jr. et al. | 340/347 AD |
| 3,594,780 | 7/1971 | Greefkes et al. | 340/347 DA |
| 4,083,045 | 4/1978 | Lattin | 340/347 AD |
| 4,118,697 | 10/1978 | Schlichte | 340/347 C |
| 4,129,863 | 12/1978 | Gray et al. | 340/347 AD |
| 4,186,383 | 1/1980 | Höfflinger et al. | 340/347 DA |
| 4,200,863 | 4/1980 | Hodges et al. | 340/347 AD |
| 4,306,300 | 12/1981 | Terman et al. | 365/45 |
| 4,344,067 | 8/1982 | Lee | 340/347 CC |
| 4,415,881 | 11/1983 | Lechner et al. | 340/347 AD |
| 4,517,549 | 5/1985 | Tsukakoshi | 340/347 AD |
| 4,523,180 | 6/1985 | Kuboki et al. | 340/347 AD |
| 4,529,965 | 7/1985 | Lee | 340/347 AD |
| 4,547,762 | 10/1985 | Ono | 340/347 DA |
| 4,567,465 | 1/1986 | Komiya | 340/347 AD |
| 4,584,568 | 4/1986 | Zomorrodi | 340/347 DA |
| 4,611,195 | 9/1986 | Shosaku | 340/347 DA |
| 4,616,212 | 10/1986 | Law et al. | 340/347 DA |
| 4,654,815 | 3/1987 | Marin et al. | 364/606 |
| 4,667,179 | 5/1987 | Law et al. | 340/347 DA |
| 4,686,507 | 8/1987 | Kessler | 340/347 AD |
| 4,706,066 | 11/1987 | Dijkmans | 340/347 DA |
| 4,764,753 | 8/1988 | Yukawa | 340/347 AD |
| 4,872,011 | 10/1989 | Pelgrom et al. | 341/150 |
| 4,882,586 | 11/1989 | Dolph et al. | 341/169 |
| 4,918,454 | 4/1990 | Early et al. | 341/172 |
| 4,940,981 | 7/1990 | Naylor et al. | 341/161 |
| 4,947,169 | 8/1990 | Smith et al. | 341/121 |
| 5,012,247 | 4/1991 | Dillman | 341/172 |
| 5,014,055 | 5/1991 | Dingwall et al. | 341/159 |
| 5,016,014 | 5/1991 | Bitting | 341/162 |
| 5,047,665 | 9/1991 | Burt | 307/355 |
| 5,049,882 | 9/1991 | Gorecki et al. | 341/143 |
| 5,072,219 | 12/1991 | Boutaud et al. | 341/150 |
| 5,084,634 | 1/1992 | Gorecki | 307/352 |
| 5,099,239 | 3/1992 | Burce et al. | 341/155 |
| 5,162,801 | 11/1992 | Powell et al. | 341/150 |
| 5,208,597 | 5/1993 | Early et al. | 341/172 |
| 5,235,333 | 8/1993 | Naylor et al. | 341/118 |
| 5,247,301 | 9/1993 | Yahagi et al. | 341/156 |
| 5,298,902 | 3/1994 | Kogan | 341/157 |

*Primary Examiner*—Jeffrey A. Gaffin
*Assistant Examiner*—Jason L. W. Kost
*Attorney, Agent, or Firm*—Testa, Hurwitz & Thibeault, LLP

[57] ABSTRACT

A multiple channel analog to digital converter utilizing common conversion circuitry for converting multiple analog signals into corresponding digital signals. The converter includes an input stage having a plurality of capacitors, each one corresponding to one of the analog signals. The capacitors sample the respective analog signals and are successively coupled to common conversion circuitry, including a CDAC and a comparator. The CDAC iteratively increments or decrements the voltage of a selected one of the sampled analog signals for comparison to a reference voltage by the comparator. The comparator output is latched by a successive approximation register to provide a parallel output signal which is fed back to control the CDAC.

32 Claims, 14 Drawing Sheets

MULTIPLE CHANNEL ANALOG TO DIGITAL CONVERTER

FIELD OF THE INVENTION

This invention relates generally to analog to digital converters and more particularly, to a multiple channel analog to digital converter.

BACKGROUND OF THE INVENTION

Analog to digital converters, including capacitor digital to analog converter (CDAC) which iteratively increment or decrement a sampled analog input signal are known. Generally, an analog input signal is sampled by a sample and hold circuit. The sample and hold circuit includes a capacitor which is charged to a voltage indicative of the input signal voltage. The sampled analog input signal is iteratively incremented or decremented by the CDAC for comparison to a reference voltage by a comparator. The comparator output is latched by a successive approximation register (SAR) to provide a parallel output signal which is fed back to control the CDAC.

More particularly, the CDAC comprises a plurality of switches, each one coupled in series with a corresponding capacitor and providing one bit of CDAC conversion. The SAR output is fed back to control the position of the CDAC switches which, in turn, determine whether and to what extent the sampled signal is incremented or decremented. In this way, the CDAC iteratively adjusts the voltage level of the sampled analog input signal and the comparator iteratively compares the adjusted signal voltage to the reference voltage for as many comparison cycles as there are bits comprising the CDAC. After a number of comparison cycles (corresponding to the number of CDAC bits) occur, the value of the latched parallel output signal is indicative of the amplitude of the sampled analog input signal.

It is often desirable to convert two or more analog signals into corresponding digital signals. One known technique for converting multiple analog signals into corresponding digital signals utilizes multiple sample and hold circuits and conversion circuits. That is, for each analog input signal to be converted, a sample and hold circuit and a conversion circuit including a comparator, a CDAC, and a successive approximation register (SAR) is provided. However, this arrangement disadvantageously requires duplication of components which concomitantly increases circuit size, manufacturing time, cost, and power dissipation while decreasing reliability. Additionally, use of multiple conversion circuits can cause conversion matching inaccuracies due to such factors as component tolerances and temperature variations.

An alternative approach for converting multiple analog signals is to successively process each signal utilizing a single sample and hold circuit and conversion circuit. While this approach eliminates circuit duplication, its use is precluded in certain applications in which the time relationship between two or more converted signals must be maintained. For example, this approach is not suitable for use when making quadrature measurements or instantaneous power measurements, both of which require measurement of the phase angle between two periodic signals.

SUMMARY OF THE INVENTION

An analog to digital converter is presently described which provides a multiple channel input stage for sampling a plurality of analog input signals and common conversion circuitry for successively converting the sampled analog input signals into corresponding digital signals. The analog input signals are sampled either simultaneously or at a predetermined rate relative to one another. In one dual-channel embodiment, the input stage has a pair of input ports, each one adapted to receive a corresponding analog input signal. The input ports are coupled to first terminals of respective capacitors which are charged to a voltage related to the voltage level of the respective analog input signal. The converter further includes a comparator having a first input adapted for selective coupling to one of the capacitors of the input stage and a second input receiving a reference voltage.

An SAR is coupled to the comparator output and latches the serial comparator output signal to provide a parallel comparator output signal. A CDAC is coupled in a feedback relationship between the output of the SAR and the first comparator input. The CDAC comprises a plurality of capacitors of predetermined values, each one coupled in series with a corresponding switch, with each switch/capacitor pair coupled in parallel. The parallel output signals of the SAR control the CDAC switches so as to increment or decrement the sampled voltage applied to the first comparator input during each comparison cycle, in accordance with the comparator output of the previous comparison cycle.

More particularly, the input stage includes sample and hold switches for selectively coupling second terminals of the capacitors to a fixed voltage, thereby permitting the capacitors to be charged to a voltage related to the respective analog input signal, and for selectively decoupling the capacitors from the fixed voltage to "hold" the sampled charge across the respective capacitor. A channel selection switch of the input stage couples a selected one of the capacitors to the first comparator input and the CDAC for conversion of the respective analog input signal. The input stage further includes CDAC coupling switches for permitting the selected one of the capacitors to provide the most significant bit plate of the CDAC.

With this arrangement, an analog to digital converter is provided for converting multiple analog input signals into corresponding digital signals. The analog input signals are sampled by an input stage and are successively converted by common conversion circuitry. Use of common conversion circuitry advantageously eliminates signal conversion mismatches and circuit duplication associated with the use of multiple converters to convert multiple signals.

In one embodiment, the input signals are simultaneously sampled by the input stage. Simultaneous input signal sampling reduces signal conversion time, as compared to sequential sampling of two or more analog signals by the same circuitry and permits use of the converter in applications in which it is necessary to maintain the time relationship between the input signals.

Alternatively, the input signals may be sampled at a predetermined rate relative to one another, so as to provide a predetermined time relationship between the sampled signals. For example, in the case of synchronous demodulation, the input signals may be sampled at ninety degrees out of phase with one another.

The analog to digital converter described herein provides immunity from the effects of the non-linear parasitic capacitances, primarily associated with FETs in the comparator. This immunity is achieved by converging the voltages at the comparator input terminals to the same level during each conversion, by using the sampling capacitors to provide the most significant bit of the CDAC and by the switching technique of the input stage. The switching technique associated with the input stage eliminates the need for isolation between the analog input signals and the sampling capacitors, such as is conventionally achieved with the use of a buffer amplifier.

BRIEF DESCRIPTION OF THE DRAWINGS

The above and further advantages of this invention may be better understood by reference to the following description in conjunction with the accompanying drawings, in which.

DESCRIPTION OF THE PREFERRED EMBODIMENT

Figure 1A:
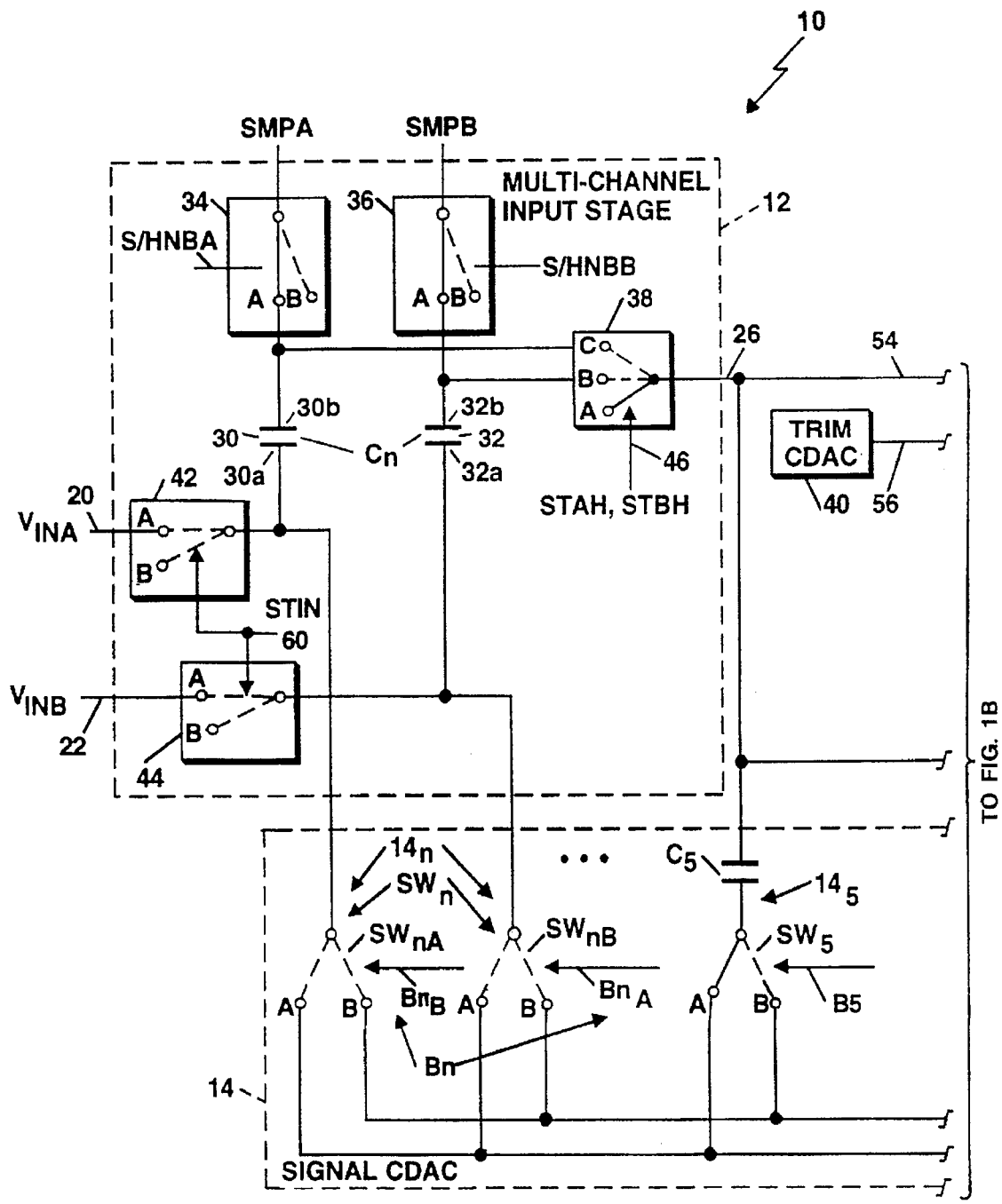
FIGS. 1A and 1B are section of a block diagram of an analog to digital converter in accordance with the present invention.
Figure 1B:
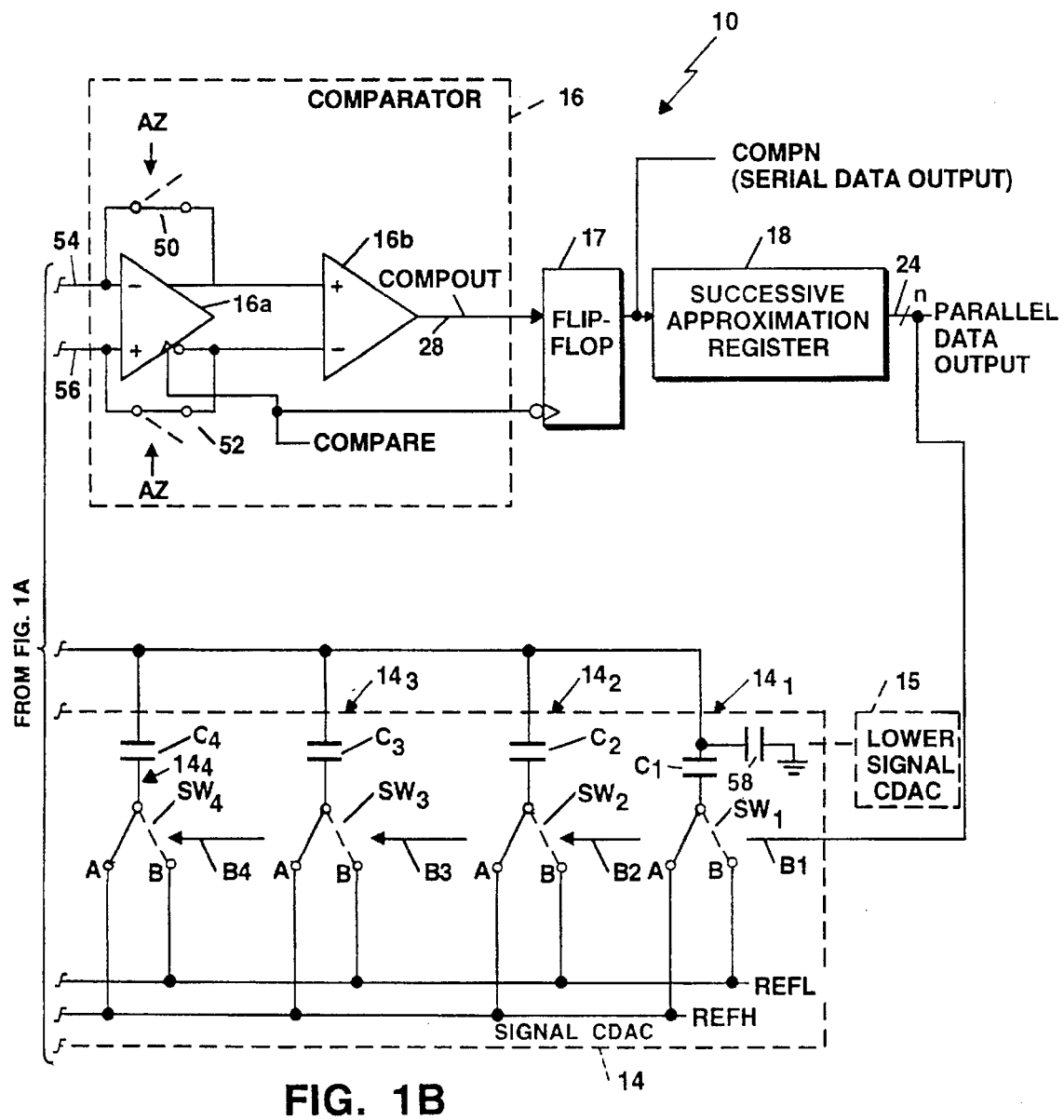

Referring to FIGS. 1A and 1B, an analog to digital converter 10 includes a multiple channel input stage 12, a signal capacitor digital to analog converter (signal CDAC) 14, a comparator 16, a flip-flop 17, a successive approximation register (SAR) 18 and a trim CDAC 40. The converter 10 converts multiple analog input signals $V_{INA}$, $V_{INB}$ into corresponding digital signals on signal line 24. Although the converter 10 is adaptable to process more than two analog input signals, the illustrative embodiment processes two analog input signals $V_{INA}$, $V_{INB}$ corresponding to channels A and B, respectively. The analog input signals $V_{INA}$, $V_{INB}$ are sampled by the input stage 12 and are successively converted into respective digital signals on line 24 by common conversion circuitry, including the signal CDAC 14, comparator 16, flip-flop 17, SAR 18 and trim CDAC 40, as will be described.

The input stage 12 includes a pair of capacitors 30, 32, each one coupled to one of the input channels A, B and, more specifically, having a first terminal 30a, 32a coupled to a respective input port 20, 22. CDAC coupling switches 42, 44 are disposed between the first terminals 30a, 32a of capacitors 30, 32 and input ports 20, 22, respectively, as shown. CDAC coupling switches 42, 44 have a first, input signal sampling position A in which the input ports 20, 22 are connected to capacitors 30, 32, respectively, and a second, open position B in which the input ports 20, 22 are disconnected from the capacitors 30, 32, in response to a control signal STIN on line 60. The first terminals 30a, 32a of capacitors 30, 32 are further adapted for coupling to the signal CDAC 14 to provide the most significant bit when the CDAC coupling switches 42, 44 are in the open position B, as will be described. The CDAC coupling switches 42, 44 and the most significant bit switch $SW_n$ of the signal CDAC 14, comprising individual switches $SW_{nA}$, $SW_{nB}$, are controlled such that, at any given time, the first terminals 30a, 32a of capacitors 30, 32 are either: (1) coupled to the respective input port 20, 22 via CDAC coupling switches 42, 44; (2) coupled to a reference voltage REFH by the most significant bit switches $SW_{nA}$, $SW_{nB}$ being in position A; or (3) coupled to a reference voltage REFL by the most significant bit switches $SW_{nA}$, $SW_{nB}$ being in position B.

Input stage sample and hold switches 34, 36 are disposed between fixed voltages SMPA, SMPB and second terminals 30b, 32b of a respective capacitor 30, 32. A control signal S/HNBA toggles sample and hold switch 34 between a first, closed position A in which the fixed voltage SMPA is connected to the second terminal 30b of capacitor 30 and a second, open position B in which the capacitor 30 is disconnected from the fixed voltage SMPA to define the hold instant. Similarly, a control signal S/HNBB toggles sample and hold switch 36 between a first, closed position A in which the fixed voltage SMPB is connected to the second terminal 32b of capacitor 32 and a second, open position B in which the capacitor 32 is disconnected from the fixed voltage SMPB to define the hold instant.

Sample and hold control signals S/HNBA, S/HNBB may be identical so as to cause the analog input signals $V_{INA}$, $V_{INB}$ to be simultaneously sampled or alternatively, may define a predetermined time relationship between the sampling of the first analog input signal $V_{INA}$ and the sampling of the second analog input signal $V_{INB}$. For example, in synchronous demodulation applications, it may be desirable to couple the same analog input signal to the first terminal 30a, 32a of both capacitors 30, 32 and to provide the control signals S/HNBA, S/HNBB at a ninety degree phase relationship with respect to one another. With such an arrangement, an incident signal is provided by one capacitor and a quadrature signal by the other capacitor.

Figure 3A:
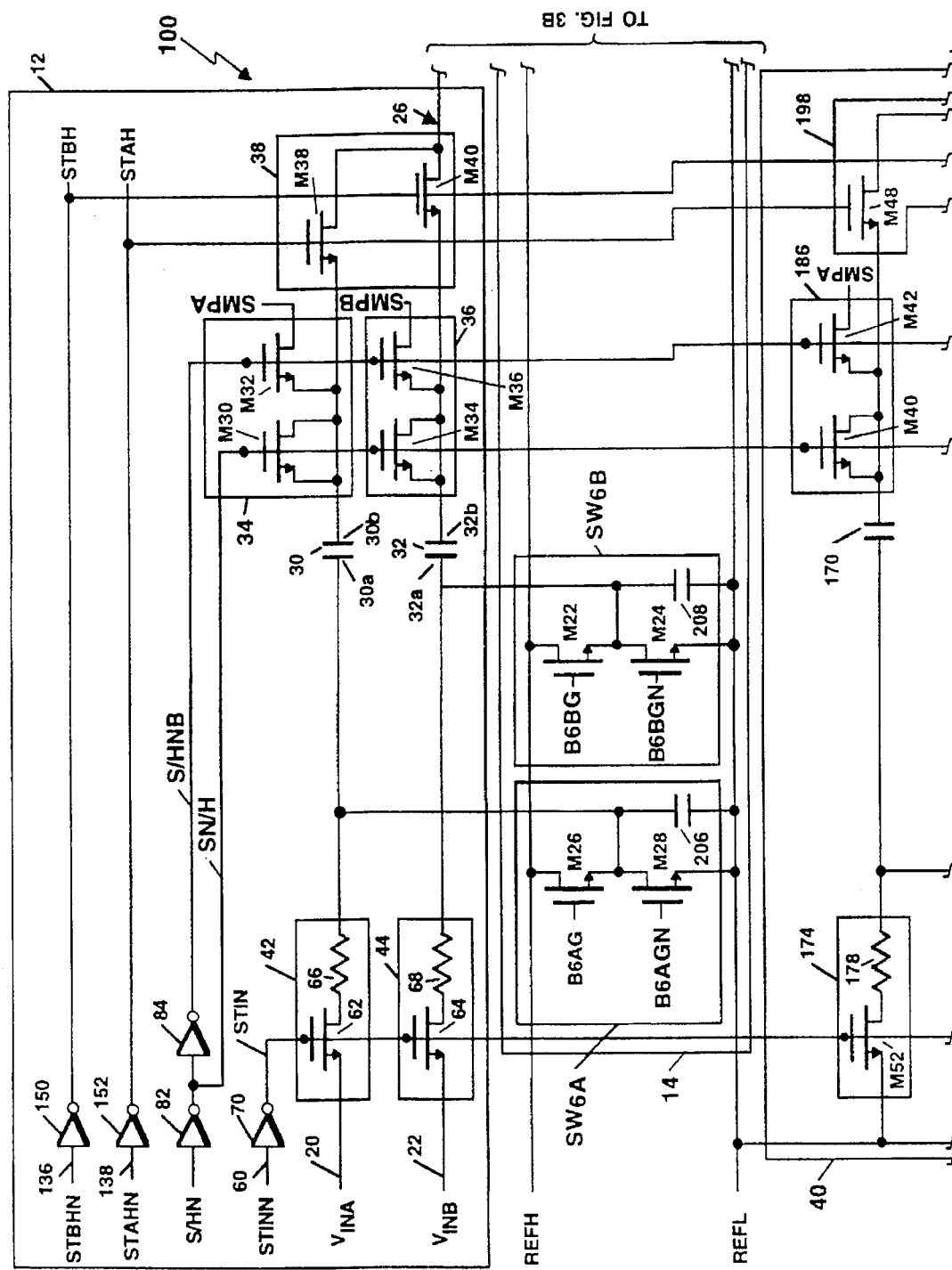
FIGS. 3A through 3E are sections of a schematic of the input stage, the signal CDAC, and the trim CDAC of the analog to digital converter of FIG. 2A.

In the illustrative embodiment described hereinafter, the analog input signals $V_{INA}$, $V_{INB}$ are simultaneously sampled, such as is desirable in applications where it is necessary to maintain the time relationship between the input signals $V_{INA}$, $V_{INB}$. To this end, the control signals S/HNBA, S/HNBB are identical and may be provided by the same signal S/HNB (FIG. 3A). During sample intervals of operation, the sample and hold switches 34, 36 are in position A to connect fixed voltages SMPA, SMPB to the second terminals 30b, 32b of capacitors 30, 32 and the switches 42, 44 are in position A, to permit capacitors 30, 32 to be charged to a voltage related to the respective analog input signal $V_{INA}$, $V_{INB}$. More particularly, switches 34, 36 are commonly actuated so that capacitor terminals 30b, 32b are simultaneously connected to respective voltages SMPA, SMPB and simultaneously disconnected from such voltages. The fixed voltages SMPA, SMPB are generated by the comparator 16 and have the same voltage level as each other, as will be described in conjunction with FIGS. 5A and 5B.

The second terminals 30b, 32b of capacitors 30, 32 are further adapted for coupling to an output port 26 of the input stage 12 (hereinafter circuit node 26). More particularly, a three-pole single throw channel selection switch 38, responsive to control signals STAH, STBH on lines 46, is coupled between the second terminals 30b, 32b of capacitors 30, 32 and node 26, as shown. During the sample interval of operation, the channel selection switch 38 is in a first position A, in which the node 26 is not connected to either of the capacitors 30, 32. When channel A is selected for conversion, switch 38 is moved to position C, in which the node 26 is connected to capacitor 30. When channel B is selected for conversion, switch 38 is moved to position B, in which the node 26 is connected to capacitor 32.

Node 26 is connected to the signal CDAC 14 and to the inverting input 54 of comparator 16, as shown. The voltage at node 26 is an iteratively adjusted version of a selected one of the sampled analog input signals (i.e., referred to hereinafter as the adjusted sample signal). The non-inverting input 56 of comparator 16 is connected to the trim CDAC 40 which provides a reference voltage for differential comparison to the adjusted sample signal, as will be described. The comparator 16 provides an output signal COMPOUT 28 to flip-flop 17 for further coupling to the SAR 18. The SAR 18 includes a plurality of flip-flops or latches (FIG. 2B), the outputs of which provide an n-bit parallel data output signal on signal line 24, which is fed back to control the signal CDAC 14.

The signal CDAC 14 provides n-bits $14_1$–$14_n$ of signal conversion and converts the n-bit parallel data output signal on signal line 24 into an analog adjustment signal which is summed, at node 26, with the sampled analog input signal at the second terminal $30b$, $32b$ of the selected one of the capacitors 30, 32 to provide the adjusted sample signal at node 26. More particularly, the signal CDAC 14 includes a switch $SW_1$–$SW_n$ and a capacitor $C_1$–$C_n$, respectively, for each bit $14_1$–$14_n$ of signal conversion. A selected one of the input stage capacitors 30, 32 provides the most significant bit plate, (capacitor $C_n$), and capacitors $C_1$–$C_{n-1}$ are associated with the lesser significant bits $14_1$–$14_{n-1}$. The most significant bit switch $SW_n$ includes individual switches $SW_{nA}$, $SW_{nB}$, each one corresponding to a respective one of the input channels A, B.

The CDAC capacitors $C_1$–$C_n$ are sized so that "testing" successive bits, by closing successive CDAC switches $SW_1$–$SW_n$ corresponds to decrementing the voltage at node 26 on each successive test. To this end, the capacitance of each of the CDAC capacitors $C_1$–$C_n$ is double the capacitance associated with the capacitor of the preceding CDAC bit. In the illustrative embodiment, described further in conjunction with FIGS. 2 through 6, the signal CDAC 14 is a six bit CDAC (i.e., n=6) and capacitors 30 and 32, a selected one of which provides CDAC capacitor $C_6$, are 6.4 pF, capacitor $C_5$ is 3.2 pF, capacitor $C_4$ is 1.6 pF, capacitor $C_3$ is 0.8 pF, capacitor $C_2$ is 0.4 pF, and capacitor $C_1$ is 0.2 pF. The signal CDAC 14 further includes a capacitor 58, connected between node 26 and ground, and having a value of 0.2 pF. It is noted that various combinations of bits can be tested during each comparison in order to vary the input voltage range.

While a six bit converter is shown in the figures and described herein for simplicity, the number of bits of conversion can be readily varied. For example, in one embodiment, a lower signal CDAC 15 (shown in dotted lines) which is capacitively coupled to node 26 by capacitor 58 (i.e., with the connection between capacitor 58 and ground removed) is added to provide a twelve bit converter. The lower signal CDAC 15 is substantially identical to the signal CDAC 14, with the exception that the lower signal CDAC 15 does not include a counterpart to capacitor 58 and the lower signal CDAC 15 includes only a single most significant bit capacitor. Capacitor 58 attenuates the effect of the lower bits of conversion provided by the lower signal CDAC 15 by a factor of sixty-four.

The CDAC switches $SW_1$–$SW_n$ are adapted for being in a first position A, in which the corresponding capacitor $C_1$–$C_n$ is connected to the reference voltage REFH, or in a second position B, in which the corresponding capacitor is connected to the reference voltage REFL. The position of CDAC switches $SW_1$–$SW_n$ is controlled by respective bit signals B1–Bn (i.e., B1–B6 in the illustrative embodiment) of the parallel data output signal on signal line 24. The most significant bit signal B6 is used in respective conversion intervals A, B to generate signals $B6_A$, $B6_B$ to control the respective most significant bit switches $SW_{6A}$, $SW_{6B}$.

The comparator 16 includes a regenerative stage $16a$ and a gain stage $16b$, as will be described below in conjunction with FIGS. 5A and 5B. The comparator 16 further includes a pair of reset switches 50, 52, for resetting the comparator input terminals 54, 56. The reset switches 50, 52 are closed during DAC reset intervals of operation (i.e., before each channel A, B is selected for conversion) by an AZ control signal so as to remove the residual differential voltage on the signal CDAC 14 and trim CDAC 40 left over from previous operations, as will be described.

In operation, analog input signals $V_{INA}$, $V_{INB}$ are simultaneously sampled during a first predetermined sample interval of operation, in which the sample and hold switches 34, 36 are in the closed position A, thereby connecting the fixed voltages SMPA, SMPB to the second terminals $30b$, $32b$ of capacitors 30, 32, respectively. During the sample interval, the CDAC coupling switches 42, 44 are in the first position A to couple the input analog signals $V_{INA}$, $V_{INB}$ to the first terminals $30a$, $32a$ of capacitors 30, 32, respectively. The channel selection switch 38 is in the first, disconnected position A and the reset switches 50, 52 are closed, as shown by the solid lines, to reset the comparator input terminals 54, 56. With the converter switches thus positioned, each of the input analog signals $V_{INA}$, $V_{INB}$ charges the respective capacitor 30, 32 to a voltage related to the input signal voltage. Specifically, capacitor 30 is charged to a voltage equal to SMPA–$V_{INA}$ (disregarding any voltage drops across the switches) and capacitor 32 is charged to a voltage equal to SMPB–$V_{INB}$.

During a second predetermined hold/reset interval of operation, fixed voltages SMPA, SMPB are simultaneously disconnected from the capacitors 30, 32 so as to "hold" the charge across the capacitors 30, 32. To this end, sample and hold switches 34, 36 are opened, in position B, to disconnect fixed voltages SMPA, SMPB from capacitors 30, 32. The STIN control signal causes CDAC coupling switches 42, 44 to move to position B, thereby disconnecting the first terminals $30a$, $32a$ of capacitors 30, 32 from input ports 20, 22, respectively. The channel selection switch 38 remains in its initial position A.

Having sampled the input analog signals $V_{INA}$, $V_{INB}$ and reset the comparator input terminals 54, 56, the reset switches 50, 52 are opened to release the comparator inputs. Thereafter, one of the input channels A, B is selected for processing by the analog to digital conversion circuitry, including the signal CDAC 14, comparator 16, flip-flop 17, SAR 18 and trim CDAC 40, during a third predetermined conversion interval of operation. More particularly, control signals STAH, STBH, coupled to the channel selection switch 38, determine the input channel selected for conversion. Consider for example, the case where input channel A is selected for conversion. Control signal STAH transitions to cause channel selection switch 38 to move to position C, corresponding to node 26 being connected to capacitor 30. The sample and hold switches 34, 36 remain open to keep the fixed voltages SMPA, SMPB disconnected from capacitors 30, 32.

The n-bit parallel data output signal on signal line 24, comprising individual bit signals B1–Bn, is initialized to test the most significant bit $14_n$ of CDAC 14 during a first comparison cycle of the channel A conversion interval of operation. Note that a comparison cycle may be a fraction or a multiple of a clock cycle. To this end, the most significant bit signals $Bn_A$, $Bn_B$ are initially in a logic high state, corresponding to most significant bit switches $SW_{nA}$ and $SW_{nB}$ being in position A to connect capacitors 30, 32 to REFH. The remaining bit signals B1–B5 are in a logic low state, corresponding to switches $SW_1$–$SW_5$ being in position B, thereby connecting capacitors $C_1$–$C_5$ to REFL. With this arrangement, the voltage at node 26 is equal to the initialized voltage at node 26, $V_{RES}$, plus the sum of the voltage across capacitor 30 and the adjustment signal provided by signal CDAC 14, as will be described further below. The above-described CDAC switch arrangement results in the signal CDAC 14 providing an adjustment voltage of (REFH–REFL)/2 (i.e., the differential reference voltage multiplied by the capacitance of capacitor 30 divided by the sum of the capacitances of capacitors 30, 58 and $C_1$–$C_5$).

Comparator 16 differentially compares this adjusted sample signal at node 26 to the reference voltage provided by the trim CDAC 40 at the non-inverting comparator input 56, as will be described further below. The trim CDAC output voltage at terminal 56 is adjusted to compensate for offset voltages and linearity errors in the signal CDAC 14, as will be described. The comparator output 28 is latched by the flip-flop 17 to provide a serial data output signal COMPN. The SAR 18 provides the parallel data output signal on signal line 24 for testing the next most significant CDAC bit $14_5$ during the next conversion comparison cycle, as described further below.

During the next channel A conversion comparison cycle, the next most significant CDAC bit $14_5$ is tested by providing bit signal B5 in a logic high state and bit signals B1–B4 at a logic low level. The state of the most significant bit signal Bn during the second comparison cycle depends on the comparator output of the preceding, first comparison cycle. Specifically, if the adjusted sample signal at node 26 was greater than the trim CDAC reference voltage during the first conversion comparison cycle, then the most significant bit is reset during the next comparison cycle (i.e., bit signal Bn transitions to a low state). Whereas, if the adjusted sample signal was less that the trim CDAC reference voltage during the first conversion comparison cycle, then the most significant bit is not reset during the next comparison cycle (i.e., bit signal Bn remains high).

Considering first the case where the most significant bit signal Bn is not reset during the second comparison cycle, then switches $SW_{nA}$, $SW_{nB}$ and $SW_5$ are in position A to connect capacitors 30, 32 and C5 to REFH and switches $SW_1$–$SW_4$ are in position B to connect capacitors $C_1$–$C_4$ to REFL. With this arrangement, the voltage at node 26 is equal to the preceding voltage at node 26 during the first comparison cycle (i.e., (REFH–$V_{INA}$)/2) minus a signal CDAC adjustment voltage of (REFH–REFL)/4. On the other hand, if the most significant bit signal Bn is reset during the second channel A conversion comparison cycle, then switches $SW_{nA}$, $SW_{nB}$, and $SW_1$–$SW_4$ are in position B and only switch $SW_5$ is in position A. With this arrangement, the voltage at node 26 is equal to the preceding voltage at node 26 during the first comparison cycle (i.e., (REFH–$V_{INA}$)/2) minus a signal CDAC adjustment voltage of –[(REFH–REFL)/2]+[(REFH–REFL)/4]. This process, of successively setting the switches $SW_1$–$SW_n$ to test successive bits in accordance with the preceding comparator output, differentially comparing the adjusted sample signal at node 26 to the trim CDAC reference voltage, and latching the comparator output into the SAR 18, continues for "n" comparison cycles, after which the parallel data output signal on signal line 24 is indicative of the amplitude of the sampled analog input signal $V_{INA}$.

Having converted the first analog input signal $V_{INA}$ into a corresponding digital signal, the conversion process is repeated for channel B. More particularly, during a fourth predetermined reset interval, the converter 10 is reset by closing and then opening reset switches 50, 52. This process resets the comparator input terminals 54, 56 to remove residual differential voltage on the signal CDAC 14 and the trim CDAC 40, as will be described in conjunction with FIGS. 5A and 5B.

During a fifth predetermined conversion interval, channel B is selected for conversion by moving the channel selection switch 38 to position B to connect the second terminal 32b of capacitor 32 to node 26. Thereafter, the process of testing successive conversion bits, from the most significant bit $14_n$ to the least significant bit $14_1$, is repeated for channel B. Once the SAR 18 has latched "n" comparator output signals, the parallel data output signal on signal line 24 is indicative of the amplitude of the second analog input signal $V_{INB}$.

With this arrangement, an analog to digital converter 10 is provided with a multiple channel input stage 12 for sampling two or more analog input signals. The multiple channel input stage 12 is selectively coupled to common conversion circuitry for successive signal conversion of the sampled analog input signals. Use of common conversion circuitry advantageously eliminates circuit duplication often associated with multiple signal conversion and the concomitantly increased circuit size and manufacturing cost associated therewith. Moreover, signal conversion mismatches associated with the use of different conversion circuitry are eliminated.

In applications where the analog input signals are simultaneously sampled, the processing time is reduced as compared to successive sampling of multiple input signals. Simultaneous sampling with matched sampling capacitors 30, 32 is advantageous in applications in which the time and amplitude relationships between two or more input signals must be maintained. Alternatively, sampling the input signals at a predetermined rate relative to one another is advantageous in applications in which a predetermined time relationship between the analog input signals is desired.

Coupling the input stage capacitors 30, 32 to the signal CDAC 14 to provide the most significant plate reduces the converter parts count. This is because an additional capacitor, otherwise necessary to provide the most significant bit of signal conversion, is eliminated.

Use of the switch scheme employed in the input stage 12 as well as the convergence of the voltages at the comparator input terminals during each conversion, eliminates the effect of nonlinear parasitic capacitances, primarily associated with the comparator FETs. Moreover, the converter described herein eliminates the need for isolating the analog input signals from the sampling capacitors, such as with a buffer amplifier used in conventional sample and hold circuits.

It will be appreciated that the analog to digital converter 10 is readily adaptable to process more than the two analog input signals described here. That is, the dual-channel input stage 12 can be adapted to receive three or more analog input signals for sampling and successive coupling to common conversion circuitry comprising the signal CDAC 14, comparator 16, SAR 18 and trim CDAC 40. To this end, additional sampling capacitors corresponding to additional analog input signals are provided in the input stage and are coupled to corresponding sample and hold switches, like switches 34, 36. The sample and hold switches of the input stage are controlled so that the capacitors are charged to a voltage indicative of the corresponding analog input signal. Additional CDAC coupling switches, like switches 42, 44 for channels A and B, are provided for any additional channels and the most significant bit switch $SW_n$ includes an individual switch for each channel, like switches $SW_{nA}$, $SW_{nB}$ for channels A and B. The input stage further includes a channel selection switch controllable to disconnect all of the sampling capacitors from the comparator input or to couple a selected one of the capacitors to the comparator input in accordance with the channel selected for conversion.

Figure 2A:
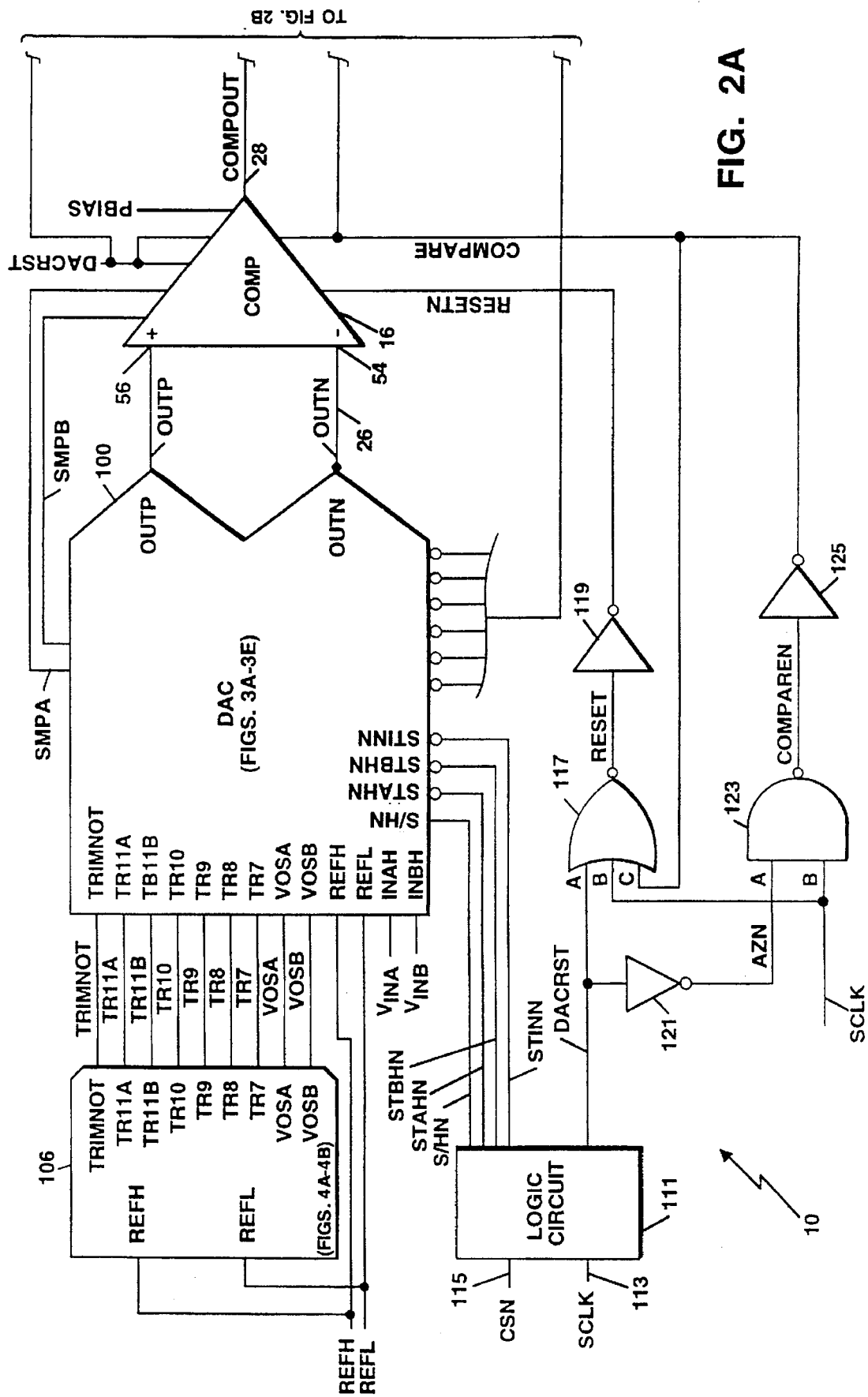
FIGS. 2A and 2B are sections of a schematic of an embodiment of the analog to digital converter of FIGS. 1A and 1B.
Figure 2B:
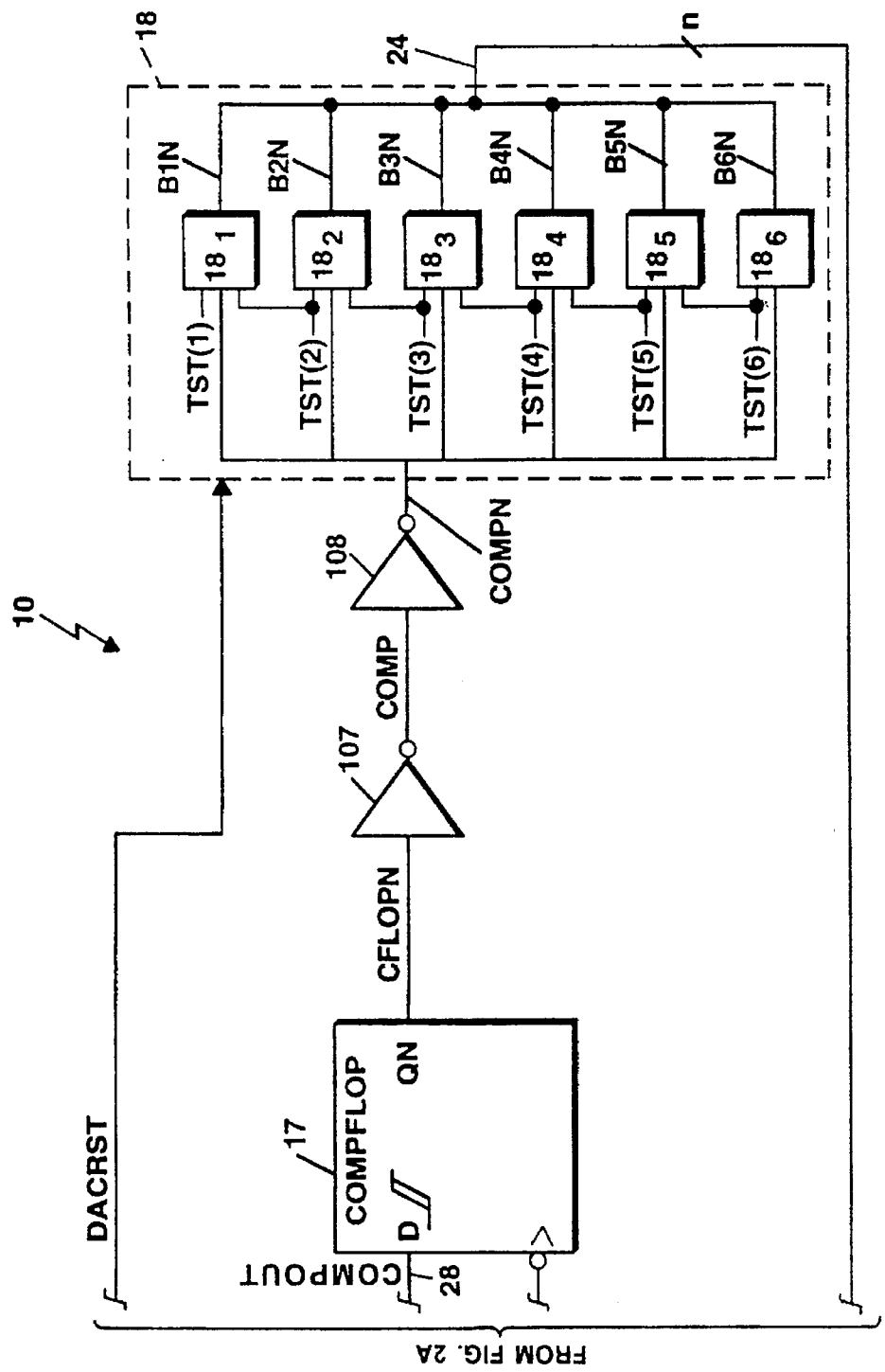

Referring also to FIGS. 2A and 2B, a schematic of an embodiment of the analog to digital converter 10 of FIGS. 1A and 1B is shown to include a DAC circuit 100 providing comparator input signals OUTP and OUTN to the non-inverting and inverting comparator input terminals 56, 54, respectively. The comparator output signal COMPOUT 28 is coupled to flip-flop 17, the output of which is inverted twice, by inverters 107, 108. The output signal COMPN of inverter 108 is coupled to the SAR 18, shown to include six latches $18_1$–$18_6$, the outputs of which provide the parallel data output signal on signal line 24 comprising individual bit signals B1N–B6N. Bit signals B1N–B6N are fed back to the DAC circuit 100 to control the signal CDAC 14 contained therein and differ from the illustrative bit signals B1–Bn of FIGS. 1A and 1B in that signals B1N–B6N are active low. Test signals TST(1)–TST(6), coupled to latches $18_1$–$18_6$, respectively, initialize and control the latches so that each bit is tested sequentially and then the COMPN data is held by each latch during the comparison cycle following the comparison cycle in which the respective bit is tested.

More particularly, each of the latches $18_1$–$18_6$ receives the COMPN signal and a respective test signal TST(1)–TST(6). Latches $18_1$–$18_5$ additionally receive the test signal TST(2)–TST(6) associated with the successive latch $18_2$–$18_6$, respectively, as shown. In operation, test signals TST(1)–TST(6) test the respective bit signals B1N–B6N during successive clock cycles and the successive signals TST(2)–TST(6) allow the COMPN signal to pass through the preceding latch $18_1$–$18_5$ during the comparison cycle after the bit associated with such latch is tested. Thereafter, the state associated with the preceding latch is captured for the remainder of the conversion, until the DACRST signal goes high to clear the latches $18_1$–$18_6$ (i.e., during sample and reset portions of converter operation). For example, during the first comparison cycle, signal TST(1) causes bit signal B1N to go low to test the most significant bit. During the second comparison cycle, signal TST(2) causes bit signal B2N to go low to test the next most significant bit and additionally causes the COMPN signal to be held in latch $18_1$. In this way, the COMPN signal at the end of the first comparison cycle determines whether the most significant bit signal B1N is reset during the second comparison cycle.

Since latch $18_6$ corresponds to the least significant bit of conversion, after this bit is tested by signal TST(6), the COMPN signal provides bit signal B6N for the remainder of the conversion. The flip-flop 17 captures the COMPOUT signal 28 and thus, provides a one clock cycle delay between the COMPOUT signal 28 and the SAR 18. A COMPARE control signal (FIG. 6) provides the clock signal to the flip-flop 17 to ensure that the COMPOUT signal 28 is captured on the falling edge of the COMPARE signal, when the COMPOUT signal 28 is valid.

Figure 3B:
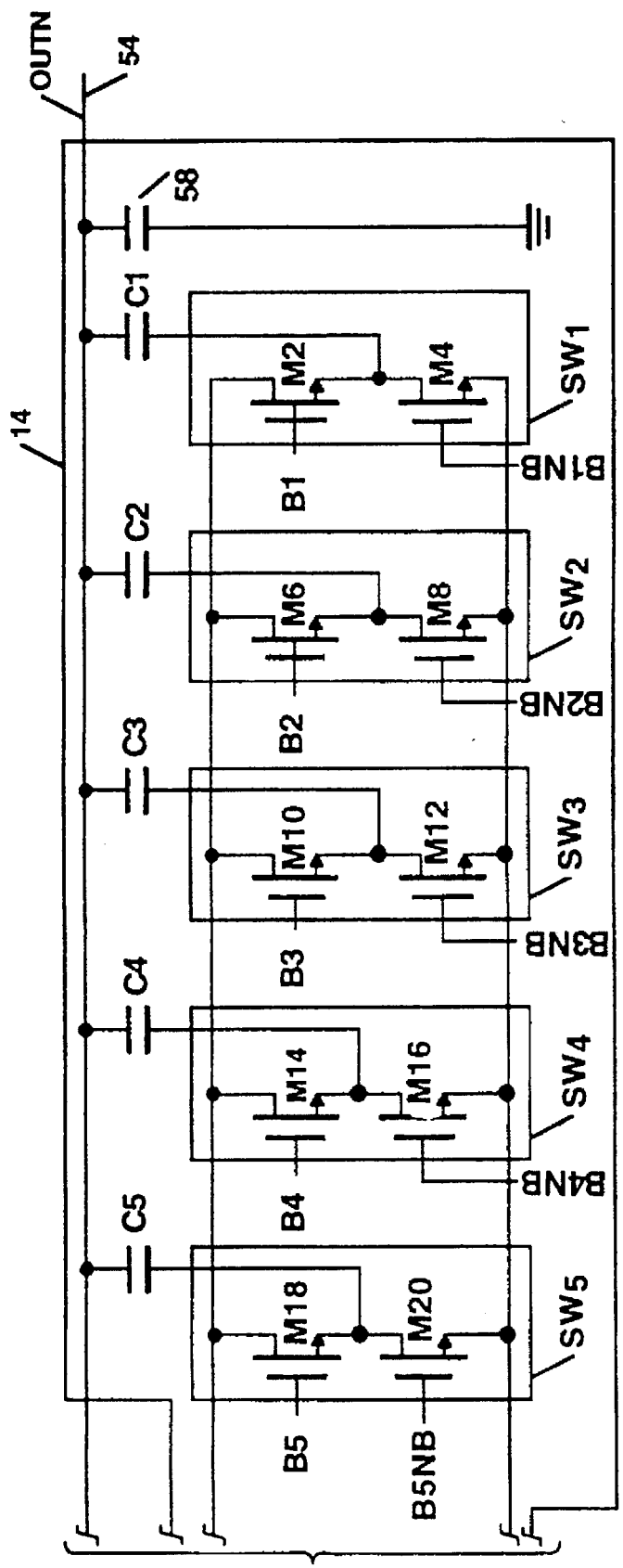
Figure 3C:
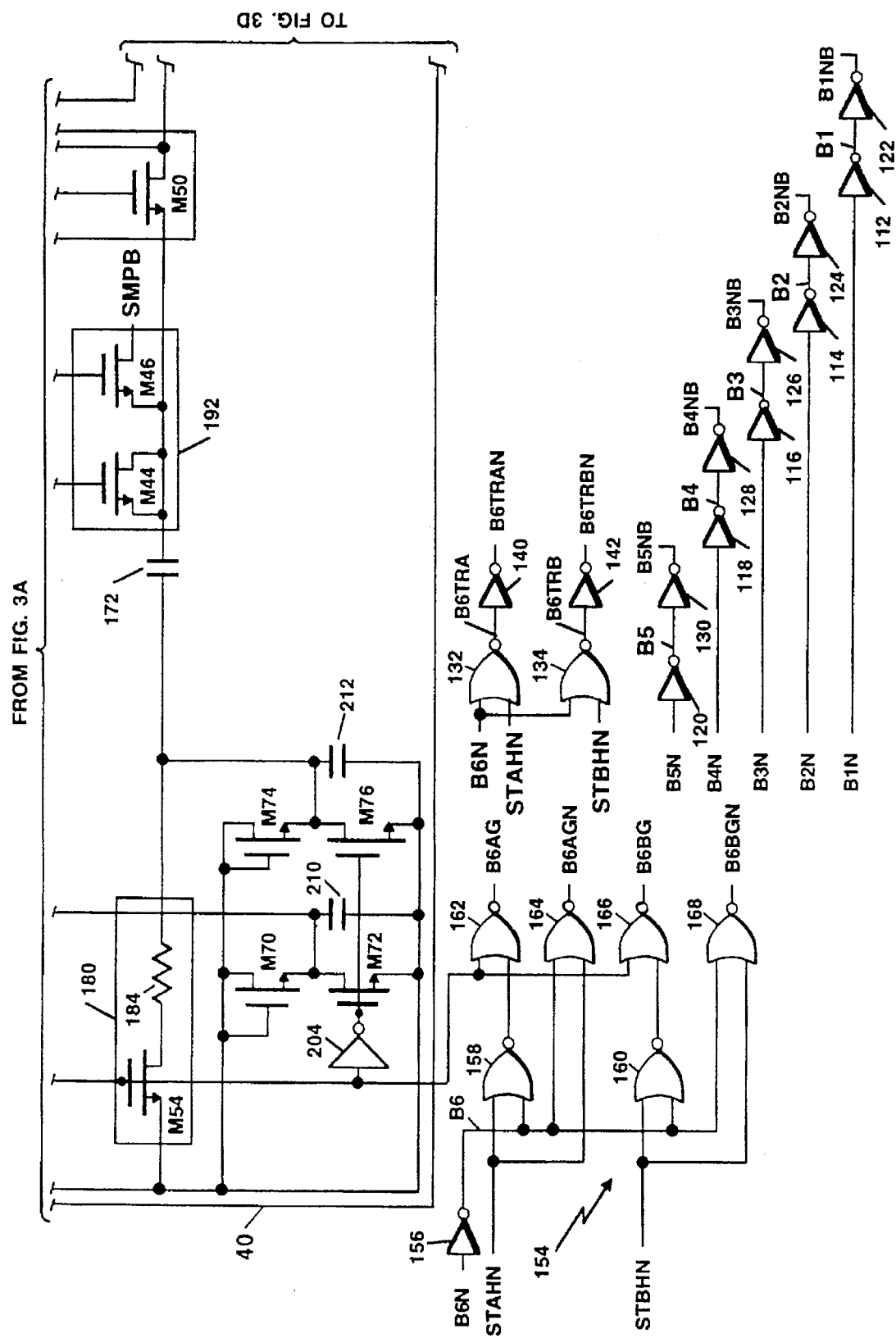
Figure 3D:
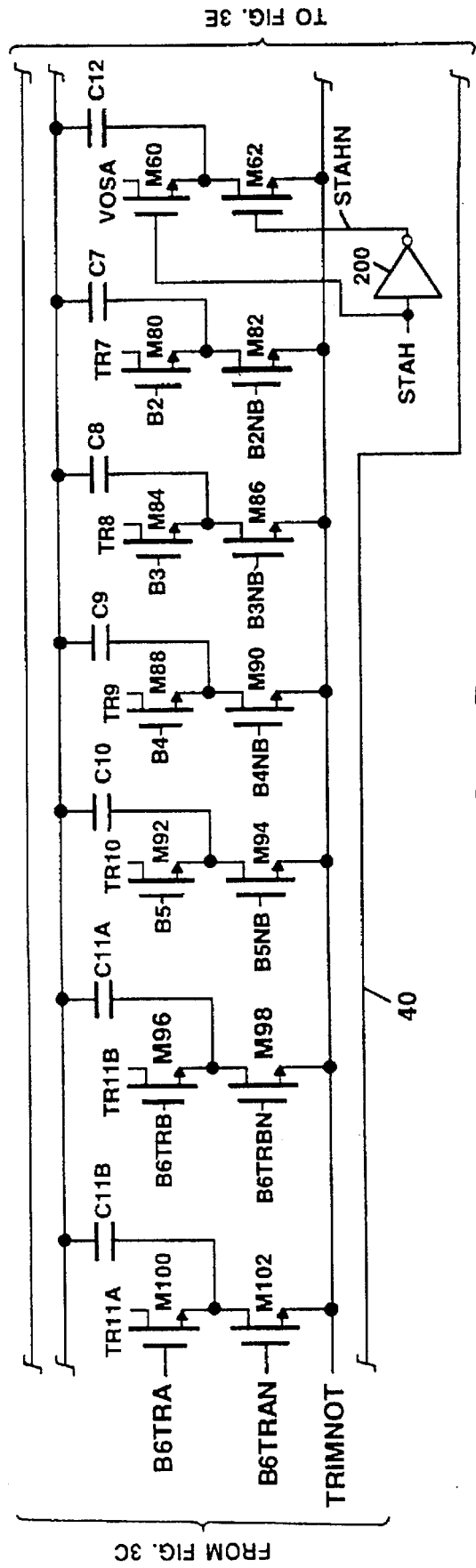
Figure 3E:
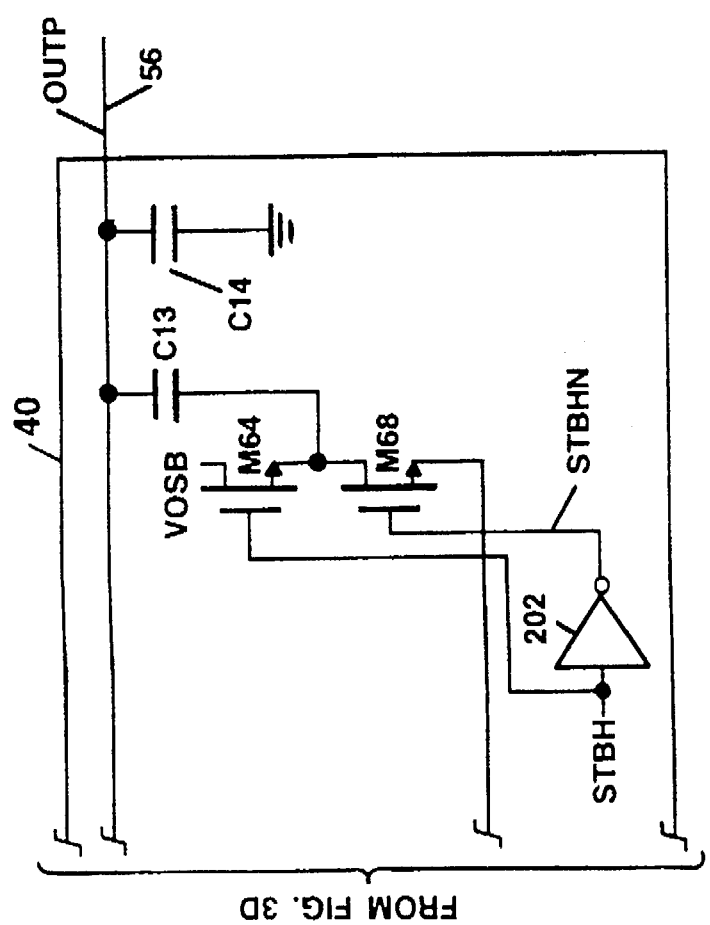

The DAC circuit 100, shown in greater detail in FIGS. 3A through 3B, includes the multiple channel input stage 12, signal CDAC 14 and a portion of the trim CDAC 40, all shown in FIGS. 1A and 1B. The trim CDAC 40 further includes a resistor network 106 which is described in further detail below in conjunction with FIGS. 4A and 4B.

Figure 5A:
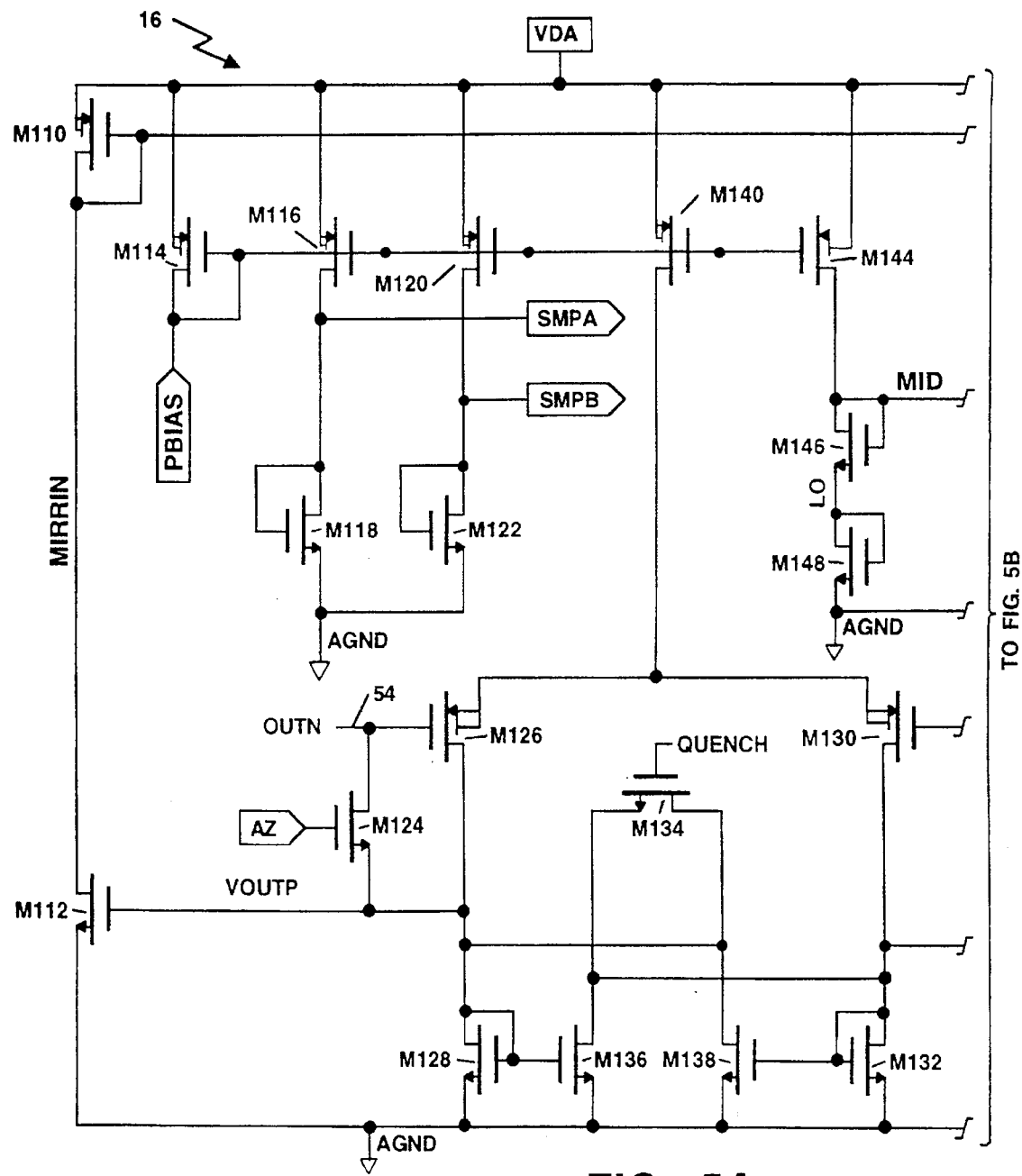
FIGS. 5A and 5B are sections of a schematic of the comparator of the analog to digital converter of FIG. 2A.
Figure 6:
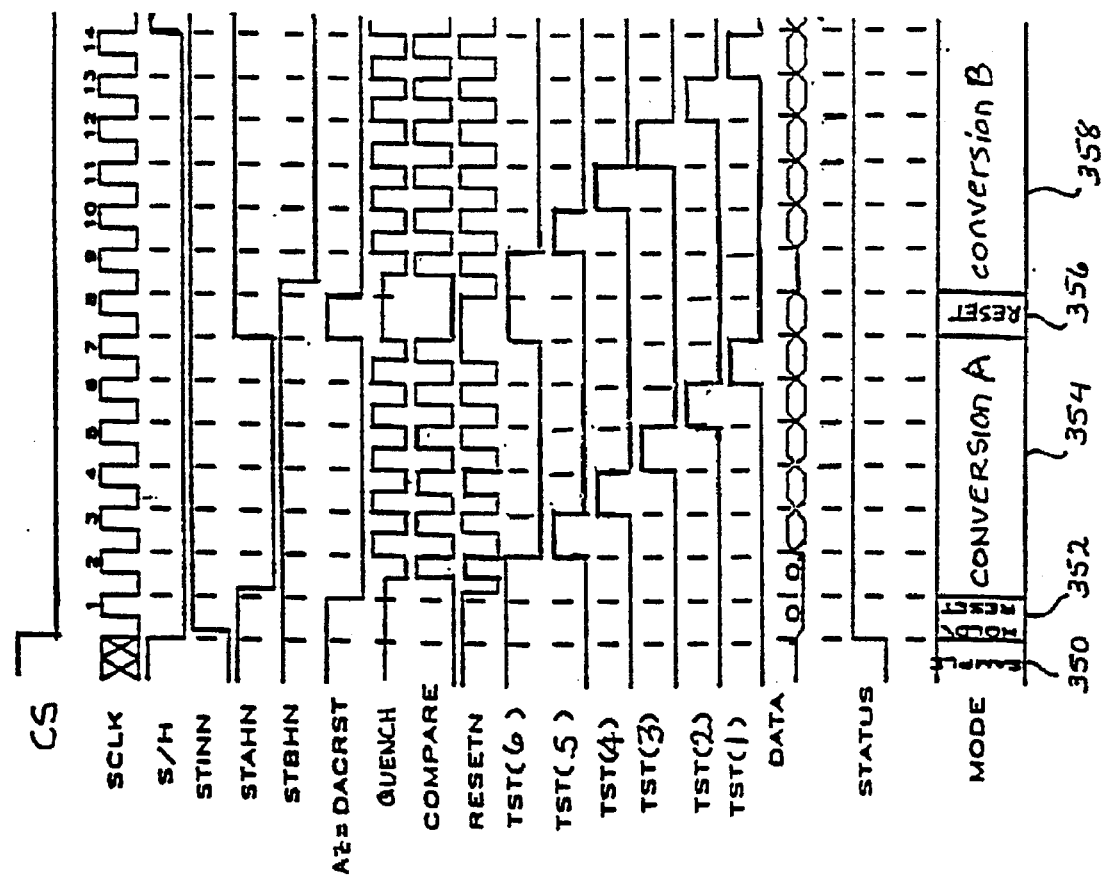
FIG. 6 is a timing diagram of illustrative signals associated with the analog to digital converter of FIGS. 2A and 2B.

Referring also to the illustrative converter signals of FIG. 6, a logic circuit 111 receives a user provided system comparison signal SCLK on line 113 and a user provided conversion initiating signal CSN on line 115. Logic circuit 111 provides control signals S/HN, STAHN, STBHN, and STINN to the DAC circuit 100, as shown, in response to input signals SCLK and CSN. Control signal S/HN determines when the first predetermined sample interval (labelled 350 in the mode representation of FIG. 6) ends and the second predetermined hold/reset interval 352 (FIG. 6) begins. Control signals STAHN and STBHN control the channel selection switch 38, thereby selecting one of the input stage capacitors 30, 32 for coupling to node 26. Control signal STINN controls CDAC coupling switches 42, 44. Logic circuit 111 further provides a DACRST logic signal to a NOR gate 117, the output of which is inverted by an inverter 119 to provide a RESETN signal to comparator 16. The DACRST signal is additionally coupled to an inverter 121, the output of which is coupled to a first input of a NAND gate 123 which receives the SCLK signal at a second input, as shown. The output of NAND gate 123 is inverted by an inverter 125 to provide a COMPARE signal to the comparator 16 and flip-flop 17, as shown. As is apparent from FIG. 6, the COMPARE and RESETN signals are identical during the signal conversion portions of converter operation 354, 358 and have opposite polarities during the sample interval 350, the hold/reset interval 352, and the converter reset interval 356. The AZ and DACRST signals are identical. The COMPARE signal provides a clock signal to the flip-flop 17 and is also used, with the RESETN signal, to generate a QUENCH signal (FIGS. 5A and 6).

Referring also to FIGS. 3A through 3B, a schematic of the DAC circuit 100 of FIG. 2A is shown. Converter input ports 20, 22, adapted to receive analog input signals $V_{INA}$, $V_{INB}$, are connected to CDAC coupling switches 42, 44, each one comprising a field effect transistor (FET) switch 62, 64 and a series connected resistor 66, 68, respectively. CDAC coupling switches 42, 44 are controlled by control signal STINN on line 60. More particularly, the STINN control signal is inverted by an inverter 70, with the inverter output signal STIN being connected to the gate terminal of FETs 62, 64, as shown. CDAC coupling switches 42, 44 are further connected to the first terminals 30a, 32a of sampling capacitors 30, 32, as well as to the most significant bit switches $SW_{6A}$, $SW_{6B}$, respectively.

Each of the CDAC switches $SW_1$–$SW_6$ comprises a complementary pair of FETs M2, M4–M26, M28, respectively, coupled between REFH and REFL and controlled by complementary FET control signals. The switches $SW_{6A}$, $SW_{6B}$ associated with the most significant bit additionally include a bypass capacitor 206, 208, as shown. Considering exemplary CDAC switch $SW_1$, FETs M2 and M4 are controlled by complementary FET control signals B1 and B1NB. Similarly, CDAC switches $SW_2$–$SW_5$ are controlled by FET control signals B2, B2NB–B5, B5NB. Switches $SW_{6A}$, $SW_{6B}$ are controlled by FET control signals B6AG, B6AGN and B6BG, B6BGN, respectively.

A logic circuit 154 generates the control signals B6AG, B6AGN and B6BG, B6BGN provided to gate terminals of the FETs M22–M28 associated with the most significant bit CDAC switches $SW_{6A}$, $SW_{6B}$, in response to bit signal B6N and control signals STAHN, STBHN. Logic circuit 154 includes an inverter 156 providing an inverted version B6 of bit signal B6N to NOR gates 158, 160. Additional NOR gates 162–168 are arranged to provide control signals B6AG, B6AGN and B6BG, B6BGN to most significant bit FETs M26, M28 and M22, M24, respectively, as shown. Control signal B6AG is high, to connect capacitor 30 to REFH, when bit signal B6N is low indicating that the most significant CDAC bit is to be tested, control signal STAHN is low indicating that channel A is selected for conversion, and control signal STIN is low indicating that CDAC coupling switches 42, 44 are in position B (FIG. 1A), thereby disconnecting the analog input signals $V_{INA}$, $V_{INB}$ from capacitors 30, 32. Similarly, control signal B6BG is high, to connect capacitor 32 to REFH, when control signals STIN and STBHN are low and bit signal B6N is low. FET control signals B6AGN, B6BGN are high to turn on FETs M28, M24, respectively, and connect capacitors 30, 32 to REFL, when bit signal B6N is high indicating that the most significant bit is to be reset. Logic circuit 154 thus ensures that at any given time, the first terminal 30a, 32a of each capacitor 30, 32 is either (1) connected to the respective input port 20, 22 via CDAC coupling switches 42, 44; (2) connected to REFH by FETs M26, M22 of the respective switch $SW_{6A}$, $SW_{6B}$ conducting; or (3) connected to REFL by FETs M28, M24 of the respective switch $SW_{6A}$, $SW_{6B}$ conducting.

The control signals coupled to each pair of FETs of the lesser significant CDAC switches $SW_1$–$SW_5$ are complementary in that one is high when the other is low. Thus, at a given time, each CDAC capacitor $C_1$–$C_5$ is either: (1) coupled to REFH; or (2) coupled to REFL, depending on the state of the corresponding FET control signals B1, B1NB–B5, B5NB.

The lesser significant FET control signals B1, B1NB–B5, B5NB are generated in response to bit signals B1N–B5N. Bit signals B1N–B5N are connected to respective inverters 112, 114, 116, 118 and 120 to provide FET control signals B1–B5. Control signals B1–B5 are further coupled to inverters 122, 124, 126, 128 and 130 which provide buffered versions B1NB–B5NB of bit signals B1N–B5N, respectively. The most significant bit signal B6N of the parallel data output signal on signal line 24 is connected to a pair of NOR gates 132, 134, respectively. Control signals STAHN, STBHN are also connected to NOR gates 132, 134. The outputs of NOR gates 132, 134 provide signals B6TRA, B6TRB for controlling the most significant bit of the trim CDAC 40. Signals B6TRA, B6TRB are inverted by inverters 140, 142 to provide additional trim CDAC control signals B6TRAN, B6TRBN, respectively.

The second terminals 30b, 32b of capacitors 30, 32 are connected to sample and hold switches 34, 36, each of which comprises a pair of FET switches M30, M32 and M34, M36, respectively. Sample and hold switches 34, 36 are further connected to the channel selection switch 38 comprising individual FET switches M38 and M40, as shown. Control signal S/HN is inverted by an inverter 82 to provide inverted control signal SN/H which is further inverted by an inverter 84 to provide buffered control signal S/HNB. Control signal SN/H is coupled to the gate terminal of FETs M30, M34 and control signal S/HNB is coupled to the gate terminal of FETs M32, M36, as shown.

During the first, sample interval of operation 350 (FIG. 6), control signals S/HN and S/HNB are high, causing FETs M32, M36 to turn on and connect fixed voltages SMPA, SMPB to capacitors 30, 32, respectively. Control signal SN/H on the other hand is low, causing FETs M30, M34 to turn off. During the remaining operating intervals, control signal S/HNB is high causing FETs M32, M36 to remain off, thereby disconnecting capacitors 30, 32 from fixed voltages SMPA, SMPB and control signal SN/H is high causing FETs M30, M34 to conduct. FETs switches M30, M34 are provided to linearize the sampling of the analog input signals. More particularly, parasitic gate-to-source capacitance associated with FET M32 causes a step voltage to be applied to the second terminal 30b of capacitor 30 when FET M32 is turned off, at the end of the sample interval. FET M30 provides a like step voltage at the second terminal of capacitor 30 cancelling the step voltage on FET 32. In this way, the effect of the parasitic caused step voltage is cancelled, thereby linearizing the converter sampling operation.

The STAHN, STBHN control signals on lines 138, 136 are inverted by inverters 152, 150, respectively, to provide control signals STAH, STBH to the gate terminals of respective channel selection switch FETs M38, M40. When one of the control signals STAHN, STBHN is in a logic low state, the corresponding FET switch M38, M40 conducts to connect the respective capacitor 30, 32 to node 26, thereby selecting the corresponding input channel A, B for conversion.

As mentioned above, trim CDAC 40 provides a reference voltage to the non-inverting input 56 of comparator 16. More particularly, trim CDAC 40 permits differential comparison of the voltages at comparator input terminals 54, 56. To this end, trim CDAC 40 includes capacitors 170, 172 which correspond to sampling capacitors 30, 32 and are adapted for coupling to fixed voltages SMPA, SMPB via switches 186, 192, respectively. Switches 186, 192 each comprise two FETs M40, M42 and M44, M46 as shown, like sample and hold switches 34, 36, and are controlled by the same control signals SN/H, S/HNB as sample and hold switches 34, 36, as shown. Switches 174, 180 correspond to CDAC coupling switches 42, 44 and comprise a FET M52, M54 controlled by control signal STIN and a resistor 178, 184, respectively. A switch 198, comprising FET switches M48, M50, corresponds to channel selection switch 38 comprising FETs M38, M40. Trim CDAC 40 further includes FETs M70–M76, inverter 204, and capacitors 210, 212 which are connected to capacitors 170, 172 and which correspond to the most significant bit switches $SW_{6A}$, $SW_{6B}$ of the signal CDAC 14.

The trim CDAC 40 eliminates the effects of input offset voltages to the comparator 16 by balancing any offset voltage on the inverting input 54 with an offset voltage on the non-inverting input 56. This is achieved with FETs M60, M62, M64, M68, inverters 200, 202, and capacitors $C_{12}$ and $C_{13}$. Drain terminals of FETs M60 and M64 receive trimmable reference voltages VOSA, VOSB from the trim network 106 (FIGS. 2A, 4A and 4B) and the source terminal of FETs M62 and M68 receive a reference voltage TRIMNOT from trim network 106. Gate terminals of the FETs M60–M68 are controlled by control signals STAH, STBH and inverted versions thereof STAHN, STBHN, as shown. With this arrangement, FET M60 conducts to connect respective capacitor $C_{12}$ to VOSA when channel A is selected for conversion, as indicated by control signal STAH being high; whereas, FET M64 conducts to connect respective capacitor $C_{13}$ to VOSB when channel B is selected for conversion, as indicated by control signal STBH being high. Similarly, FETs M62 and M68 conduct to connect respective capacitors $C_{12}$, $C_{13}$ to TRIMNOT when control signals STAHN, STBHN are high, respectively. With this arrangement, an offset voltage is impressed on the non-inverting comparator input 56, so as to offset a like voltage impressed on the inverting comparator input 54. Resistors of the trim network 106 which determine voltages VOSA, VOSB are laser trimmed, as discussed below in conjunction with FIGS. 4A and 4B, to ensure that the voltage at comparator input 56 attributable to capacitors $C_{12}$ and $C_{13}$ and associated circuitry matches any offset voltage measured on the inverting comparator input 54.

The trim CDAC 40 further includes a capacitor/switch network, like that associated with the signal CDAC 14, for linearizing the converter operation. More particularly, due to manufacturing limitations, capacitors $C_1$–$C_5$, 58, and 30, 32 associated with the signal CDAC 14 will not have perfectly scaled capacitances. The trim CDAC 40 ensures that an appropriate step voltage is applied at the non-inverting comparator input 56 sufficient to offset the non-linearity factor attributable to capacitance variations in the signal CDAC 14 or from other sources. To this end, trim CDAC 40 receives trimmable reference voltages TR7–TR11A, TR11B, as shown, from trim network 106. Trim CDAC 40 capacitors $C_7$–$C_{11A}$, $C_{11B}$ are adapted to be coupled to either the respective reference voltage TR7–TR11A, TR11B or to TRIMNOT, depending on the state of FET control signals B2, B2NB–B5, B5NB and B6TRA, B6TRAN and B6TRB, B6TRBN, connected to gate terminals of the corresponding trim CDAC FETs M80–M102.

Figure 4A:
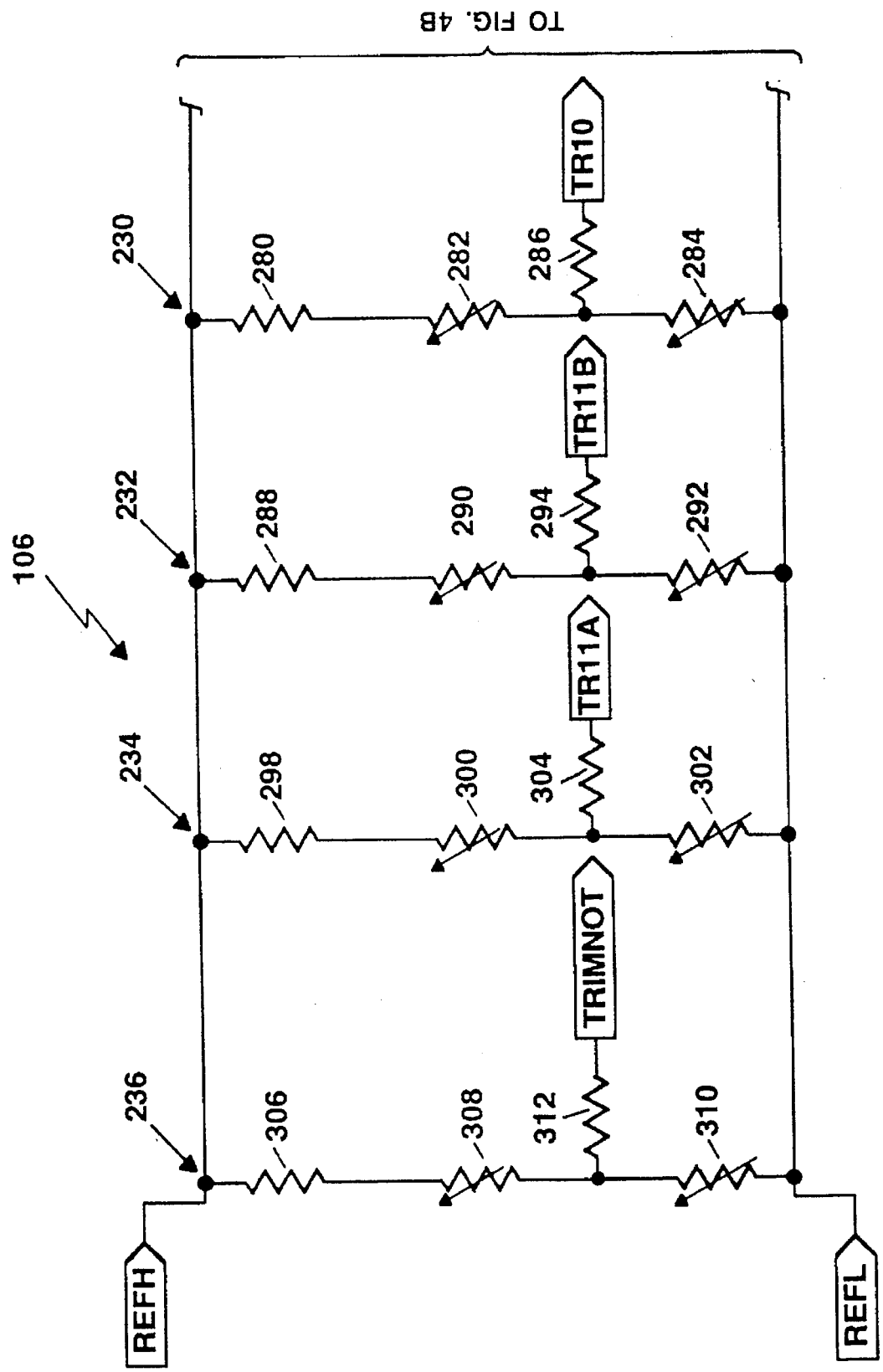
FIGS. 4A and 4B are sections of a schematic of the trim network associated with the trim CDAC of FIGS. 3A, 3C, 3D and 3E.
Figure 4B:
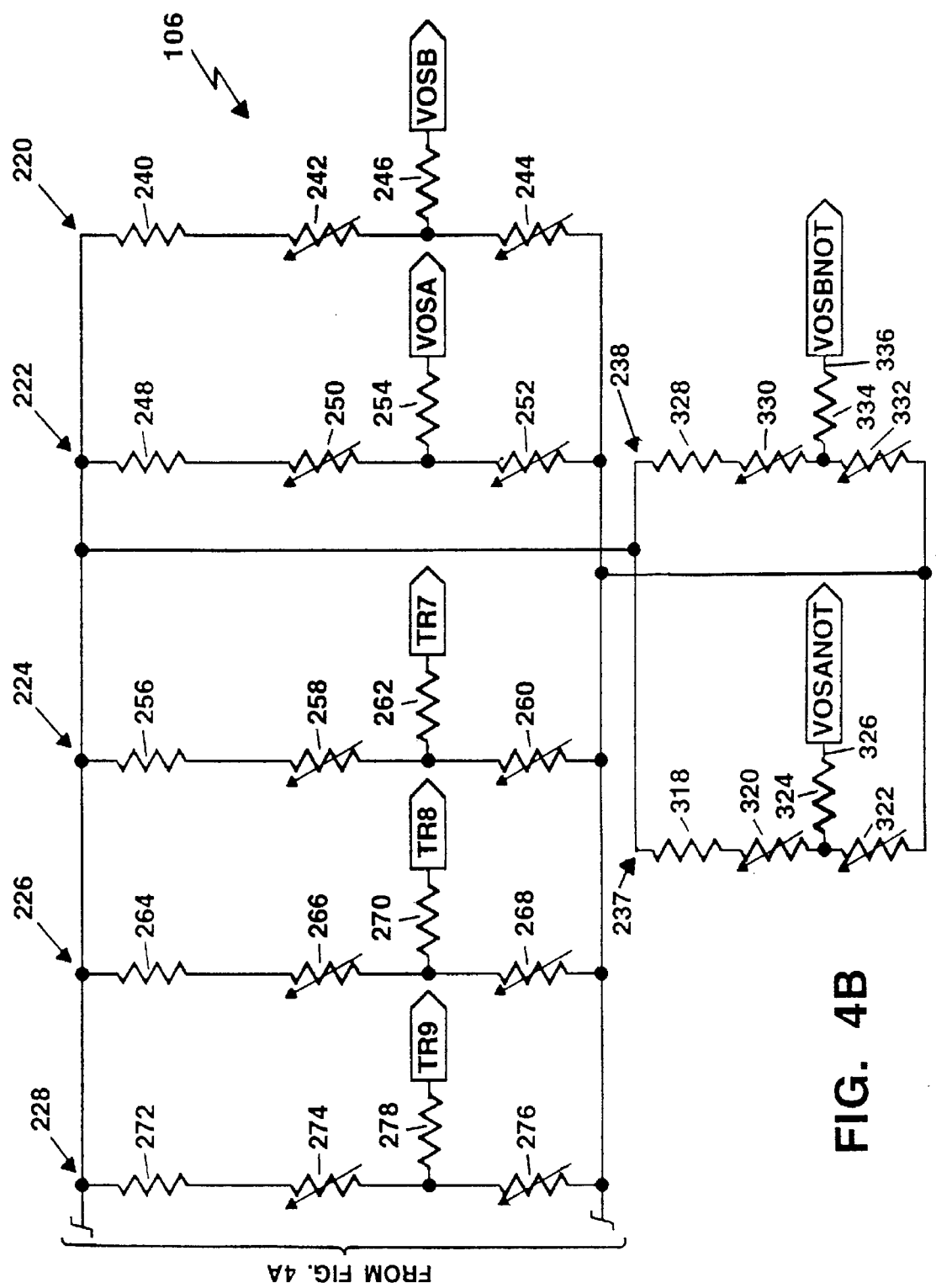

Referring also to FIGS. 4A and 4B, the trim network 106 associated with the trim CDAC 40 is shown to include a plurality of parallel adjustable resistor branches 220–236, each including three Y-connected resistors, one of which is connected in series with a fourth resistor. Two of the Y-connected resistors of each branch are variable resistors, as shown. Considering illustrative resistor branch 224 for example, resistors 258–262 are connected in a Y-arrangement, with a fourth resistor 256 connected in series with variable resistor 258. The reference voltages VOSA, VOSB, TR7–TR10, TR11A, TR11B, and TRIMNOT are provided at the end of one of the Y-connected resistors of each branch. Each of the resistor branches 220–236 is coupled across reference voltages REFH, REFL, as shown. Additional resistor branches 237, 238 are provided to permit external trimming of the reference voltages via a VOSANOT signal on line 326 and a VOSBNOT signal on line 336.

The resistor network 106 is trimmed during manufacture of the converter 10 by successively testing each bit of the signal CDAC 14. More particularly, each signal bit is tested and the resulting voltage at node 26 determined. The ratio of the measured bit voltage at node 26 to the sum of all of the bits is measured and the difference between the expected and measured ratios is determined. Any difference between the expected and measured ratios represents a differential, non-linearity error which is eliminated by trimming one or more appropriate variable resistors of the network 106. Which one of the resistor branches 220–236 is trimmed depends on which of the signal CDAC bits is being tested. For example, when the most significant bit plate associated with channel A is tested, the ratio of the capacitance of the most significant bit capacitor 30 (i.e., 6.4 pF) to the total of all of the other signal CDAC capacitances associated with capacitors $C_1$–$C_5$ and 58 (i.e., 6.4 pF) should be one. If this ratio is not equal to one, then resistors 300, 302 are trimmed accordingly. Specifically, if the ratio is greater than one, then resistors 300, 302 are trimmed to increase the reference voltage TR11A, so as to provide a greater offset step voltage at the non-inverting comparator input 56; whereas, if the ratio is less than one, then resistors 300, 302 are trimmed to decrease the reference voltage TR11A, so as to provide a lower offset step voltage at the non-inverting comparator input 56.

Figure 5B:
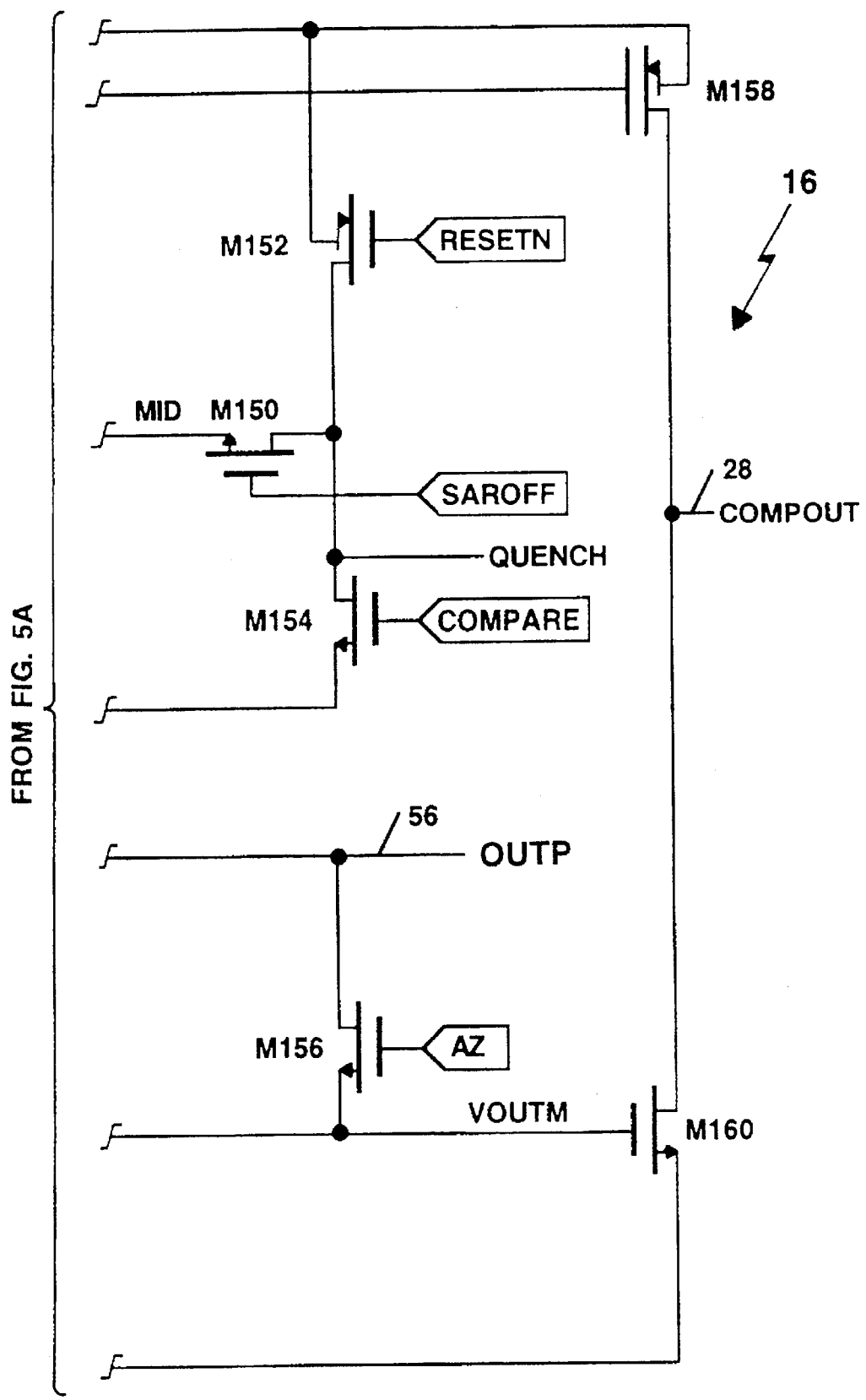

Referring also to FIGS. 5A and 5B, the comparator 16 is shown to include a differential input pair of FETs M126, M130, the gate terminals of which receive output signals OUTP and OUTN from the DAC 100 (FIGS. 2A and 3A through 3E). The source terminals of FETs M126, M130 are connected to a current sourcing FET M140 having a source terminal connected to a positive supply voltage VDA. The drain terminals of FETs M126, M130 are connected to diode-connecting clamping FETs M128, M132, respectively, and are cross-coupled via a FET M134. The gate terminals of FETs M126, M130 are further connected to FETs M124, M156, respectively, which are controlled by control signal AZ (FIG. 6), and which are further coupled to respective output nodes VOUTP, VOUTM. Clamping FETs M128, M132 have interconnected gate and drain terminals, which are further connected to the gate terminals of cross-coupled FETs M136, M138, and source terminals connected to ground.

A gain stage of the comparator 16 includes FETs M110, M112, M158 and M160 which amplify the differential voltage between circuit nodes VOUTP and VOUTM to provide the single-ended comparator output signal COMPOUT at logic levels corresponding to the positive supply voltage VDA or ground.

A mode selection portion of the comparator includes FETs M134, M144, M146, M148, M150, M152 and M154. FET M134 has a gate terminal connected to the QUENCH signal, which is generated by transistors M114 and M144–M154 in response to the RESETN and COMPARE control signals, as well as a control signal SAROFF, which is a delayed version of the AZ control signal. As is apparent from consideration of the illustrative QUENCH signal shown in FIG. 6, the QUENCH signal is an inverted version of the COMPARE and RESETN signals during the conversion intervals of operation 354, 358. During the sample interval 350, the hold/reset interval 352 and the converter reset interval 356, the QUENCH signal is at a mid-level point, between VDA and ground. More particularly, during such intervals 350, 352 and 356, the SAROFF signal is high, causing FET M150 to conduct to bring QUENCH to a mid-level voltage determined by FETs M114, M144, M146 and M148.

The AZ and QUENCH control signals provide for three modes of comparator operation. In one mode of comparator operation, occurring during the sample interval of converter operation 350 and the reset intervals of converter operation 352, 356, the AZ signal is high and the QUENCH signal is at the mid-level point (FIG. 6). The purpose of this first mode of comparator operation is to differentially store any offset voltages between comparator FETs M126 and M130, FETs M128 and M132, and FETs M136 and M138 with a desired weight on the signal CDAC 14 and the trim CDAC 40, so as to cancel such offset voltages in conversion intervals of converter operation 354, 358.

In the illustrative comparator 16, the mid-level voltage of the QUENCH signal provides a partial electrical connection between the VOUTP and VOUTM circuit nodes, such that the positive feedback between the nodes is eliminated but the nodes VOUTP and VOUTM are not shorted together. With this arrangement, the DC offset voltage at the comparator inputs 54, 56 is stored differentially on the signal CDAC 14 and trim CDAC 40 with a weight of one. That is, the drain terminals of FETs M126, M130, which are coupled to the gate terminals thereof via conducting FETs M124, M156, see a high impedance associated with cross-coupled FETs M136, M138 and clamping FETs M128, M132, respectively. Since the capacitors $C_1$–$C_5$ (FIGS. 1A and 1B) of the signal CDAC 14 connected to node 26 (i.e., to the inverting comparator input terminal 54) are further connected to the gate of FET M126 and the capacitors $C_7$–$C_{11A}$, $C_{11B}$, $C_{12}$ and $C_{13}$ of the trim CDAC 40 connected to the non-inverting comparator input terminal 56 are further connected to the gate of FET M130, any offset voltages associated with the comparator are stored differentially on the signal CDAC and trim CDAC capacitors, respectively, for the rest of the conversion.

The FETs of the mode selection portion of the comparator 16 are matched so that the drain voltages of FETs M126, M130 are substantially the same. Thus, the comparator threshold voltage (i.e., the difference between VOUTP and VOUTM above which the COMPOUT signal is brought to VDA and below which the COMPOUT signal is brought to ground) is defined based on the stored offset voltage. Stated differently, the comparator threshold voltage is at the mid-level point even when there are DC offset voltages associated with the comparator. In this way, the effect of any offset voltage is reduced.

In order for the comparator 16 to entirely eliminate the effect of any such offset voltages, it is advantageous that the weight with which the offset voltage is differentially stored on the signal CDAC 14 and the trim CDAC 40 match the weight of the total CDAC capacitance to the sampling capacitance. However, storing the offset voltage with weights that do not entirely cancel the comparator offset voltage is still advantageous since a reduction in the effect of input offset voltages is achieved. In fact, in certain applications, such as where the input offset voltages are relatively small, a weight by other than necessary to entirely cancel the offset voltage may be suitable.

The weight with which the offset voltage is stored can be readily varied, such as by adjusting the level of the QUENCH signal or by varying the size of the clamping FETs M128, M132. In the illustrative embodiment, the offset voltage is stored with a weight of one. However, since the capacitance of the sampling capacitors 30, 32 is equal to the sum of the remaining CDAC capacitors $C_1$–$C_5$, a weight of two may be desirable, in order to entirely cancel the offset voltage. One way to achieve a weight of two is by simply opening the source terminals of clamping FETs M128, M132.

FETs M124, M156 provide the reset switches 50, 52, shown in FIG. 1B. Because FETs M124, M156 short the input terminals 54, 56 to the nodes VOUTP, VOUTM, any residual differential voltage at the comparator inputs 54, 56 is removed. The reason that the SAROFF signal is delayed relative to the AZ signal is to ensure that the AZ signal goes low to terminate conduction of FETs M124 and M156 before the QUENCH signal goes low to release the circuit nodes VOUTP, VOUTM.

The remaining two modes of comparator operation occur during each conversion comparison cycle. During a first portion of each comparison cycle, the QUENCH signal is high and the AZ signal is low, thereby resetting the comparator output signal COMPOUT to the mid-level, threshold point. During a second portion of each comparison cycle, the QUENCH signal is low and the AZ signal is low, thereby releasing the circuit nodes VOUTP, VOUTM to permit the comparator to differentially compare the voltages at circuit nodes VOUTP and VOUTM in a regenerative manner. More particularly, in the regenerative manner of comparator operation, a small differential voltage between circuit nodes VOUTP and VOUTM regenerates until clamped by FETs M128, M132 and is then amplified by the gain stage to provide the comparator output signal COMPOUT in either a logic high or logic low state.

Reference voltages SMPA, SMPB are generated on the comparator 16, as mentioned above. More particularly, reference voltages SMPA, SMPB are generated by FET pairs M116, M118, and M120, M122, as shown. A PBIAS reference current provided to the comparator 16 establishes a bias current in FETs M116, M120, M140, and M144 via FET M114, as shown.

In operation, during the sample interval 350, the analog input signals $V_{INA}$, $V_{INB}$ charge respective capacitors 30, 32. Thereafter, in the hold/reset interval 352, the charge is held across capacitors 30, 32, the comparator offset voltage is impressed on the signal CDAC 14 and trim CDAC 40, and any residual differential voltage on the signal CDAC 14 and the trim CDAC 40 is removed. Also in the hold/reset interval 352, the STIN signal causes FETs 62, 64 of CDAC coupling switches 42, 44 (FIG. 3A) to open so as to steer the first terminals 30a, 32a of capacitors 30, 32 to the CDAC 14 to provide the most significant bit plate. The first analog input signal $V_{INA}$ is converted into its digital counterpart during conversion A interval 354.

More particularly, during a first conversion comparison cycle, the bit signals B1N–B6N are initialized by signals TST(1)–TST(6) to test the most significant bit. Specifically, the lower FETs M4, M8, M12, M16, and M20 of switches $SW_1$–$SW_5$ conduct to connect capacitors $C_1$–$C_5$ to REFL and upper FETs M22, M26 of the most significant bit switches $SW_{6A}$, $SW_{6B}$ conduct to connect the first terminals 30a, 32a of sampling capacitors 30, 32 to REFH. With this arrangement, the voltage across capacitor 30 is equal to $(V_{INA}-REFH)/2$. Thus, the differential voltage across the comparator inputs is equal to $(REFH-V_{INA})/2$ (plus an adjustment voltage attributable to the capacitors $C_7$–$C_{10}$, $C_{11A}$, $C_{11B}$, and $C_{12}$, $C_{13}$). Note that the voltage at the non-inverting comparator input 56 is added to the voltage at the inverting input 54 to arrive at the differential voltage; however, since the capacitor 170, is connected to REFL via switch 174 and FETs M70, M72 and is further connected to SMPA during the sampling interval of operation via FET M42, any voltage attributable to the charge across capacitor 170 of fixed voltage SMPA is cancelled.

During the second conversion comparison cycle, bit signal B5N is low to test the next most significant bit, bit 5, and bit signals B1N–B4N remain high. Whether the most significant bit signal B6N stays high or is reset during the second conversion comparison cycle depends on the comparator output at the first conversion comparison cycle. If the input voltage $V_{INA}$ is greater than REFH, then the most significant bit is not reset during the second channel A conversion comparison cycle (i.e., the B6N signal remains low). If, on the other hand, the input voltage $V_{INA}$ is less than REFH, then the most significant bit is reset during the second channel A conversion comparison cycle (i.e., the B6N signal transitions to a high level).

Consider first the case where the most significant bit is not reset during the second conversion comparison cycle. In this case, the voltage at the second terminal 30b of capacitor 30 stays at $(REFH-V_{INA})/2$. The differential voltage however becomes $[(V_{INA}-REFH)/2]-[(REFH-REFL)/4]$. If the most significant bit is reset during the second conversion comparison cycle, then the voltage at the second terminal 30b of capacitor 30 is equal to $[(REFH-V_{INA})/2]-[(REFH-REFL)/2]$. Thus, the differential voltage across the comparator inputs is $[(V_{INA}/2)]-[(REFH-REFL)/4]$.

As noted above, this process of testing successive bits during successive conversion comparison cycles and resetting or not resetting the previously tested bits in accordance with the previous comparator output is repeated for "n" conversion comparison cycles, after which the parallel data output signal on signal line 24 has a value indicative of the input analog signal $V_{INA}$. Thereafter, during the reset interval, the comparator offset voltage is impressed on the signal CDAC 14 and trim CDAC 40 and any residual differential voltage on the signal CDAC 14 and the trim CDAC 40 is removed, following which the second analog input signal $V_{INB}$ is selected for conversion in the manner described above.

Having described the preferred embodiment, those skilled in the art will realize many variations are possible which will still be within the scope and spirit of the claimed invention. It will be appreciated that the multiple channel input stage of the present invention may be used in analog to digital converters of types other than that described above. Therefore, it is the intention to limit the invention only as indicated by the scope of the claims.

I claim:

1. An analog to digital converter comprising:
   an input stage having at least two input ports and at least two capacitors, each of said at least two capacitors having a first terminal electrically coupled to a respective one of said at least two input ports,
      wherein a first one of said input ports is adapted to receive a first analog input signal and a second one of said input ports is adapted to receive a second analog input signal,
      wherein a first one of said capacitors has a second terminal adapted for selective coupling to a first fixed voltage and a second one of said capacitors has a second terminal adapted for selective coupling to a second fixed voltage; and
   a comparator having a first input terminal adapted for selective coupling to said second terminal of said first capacitor or to said second terminal of said second capacitor, said comparator providing an output signal at an output terminal, said output signal being indicative of a voltage on said first capacitor or said second capacitor.

2. The analog to digital converter recited in claim 1 wherein said input stage further comprises a switch disposed between each of said second terminals of said at least two capacitors and said first comparator input terminal, said switch adapted for being in a first position in which said second terminal of said first capacitor is electrically coupled to said first comparator input terminal, a second position in which said second terminal of said second capacitor is electrically coupled to said first comparator input terminal, or a third position in which neither said first capacitor nor said second capacitor is electrically coupled to said first comparator input terminal.

3. The analog to digital converter recited in claim 2 further comprising a DAC electrically coupled to said first comparator input terminal.

4. The analog to digital converter recited in claim 3 wherein said first and second capacitors are adapted for electrical coupling to said DAC to provide a most significant bit plate of said DAC.

5. The analog to digital converter recited in claim 6 wherein said first capacitor is electrically coupled to said DAC to provide said most significant bit plate of said DAC when said switch is in said first position and wherein said second capacitor is electrically coupled to said DAC to provide said most significant bit plate of said DAC when said switch is in said second position.

6. The analog to digital converter recited in claim 3 wherein said DAC is a capacitor DAC.

7. The analog to digital converter recited in claim 1 wherein said comparator has a second input terminal for receiving a reference voltage.

8. The analog to digital converter recited in claim 7 further comprising a trim DAC providing said reference voltage to said second input terminal of said comparator.

9. The analog to digital converter recited in claim 8 further comprising a CDAC electrically coupled to said first comparator input terminal, wherein said comparator is operable in an offset voltage reduction mode in which an input offset voltage associated with said comparator is stored on said CDAC and said trim DAC.

10. The analog to digital converter recited in claim 9 wherein said comparator comprises:
    a pair of differential input transistors, a first one of said input transistors having a gate terminal providing said first input terminal of said comparator, a source terminal and a drain terminal, a second one of said input transistors having a gate terminal providing said second input terminal of said comparator, a source terminal electrically coupled to the source terminal of said first input transistor and a drain terminal; and
    a control transistor having a gate terminal receiving a comparator mode control signal, a source terminal electrically coupled to the drain terminal of said first input transistor and a drain terminal electrically coupled to the drain terminal of said second input transistor.

11. The analog to digital converter recited in claim 1 further comprising a successive approximation register electrically coupled to said comparator output terminal, said successive approximation register providing a digital output signal corresponding to the one of said first and second analog input signals associated with the selected one of said first capacitor and said second capacitor.

12. The analog to digital converter recited in claim 1 wherein said input stage further comprises a first sample and hold switch for selectively coupling said second terminal of said first capacitor to the first fixed voltage and a second sample and hold switch for selectively coupling said second terminal of said second capacitor to the second fixed voltage.

13. A dual channel converter input stage circuit comprising:
    at least two capacitors, each one having a first terminal electrically coupled to an input port of said circuit and a second terminal;
    at least two sample and hold switches, each one having a first terminal electrically coupled to the second terminal of a corresponding one of said capacitors, a second terminal adapted for electrical coupling to a voltage source and a control terminal electrically coupled to a control port of said circuit, said control terminal switching said sample and hold switch between a first position in which the second terminal of said corresponding one of said capacitors is electrically coupled to the voltage source and a second position in which the second terminal of said corresponding one of said capacitors is not electrically coupled to the voltage source; and
    a channel selection switch having first and second terminals, each one electrically coupled to the second terminal of a corresponding one of said capacitors, and a third terminal electrically coupled to an output port of said circuit, said channel selection switch being selectively controllable to electrically couple either said first capacitor or said second capacitor to said output port.

14. The circuit recited in claim 13 wherein said control terminal of each of said at least two sample and hold switches receives a common control signal.

15. A method of converting at least two analog signals into corresponding digital signals, comprising the steps of:

sampling at least two analog signals by charging each of at least two capacitors to a voltage level related to a respective one of said at least two analog signals;

after sampling at least one of said at least two analog signals, electrically coupling a charged one of said at least two capacitors to a first input terminal of a comparator;

electrically coupling an n-bit CDAC to said first comparator input terminal; and latching an output signal provided at an output terminal of said comparator to provide an n-bit digital signal for controlling said n-bit CDAC.

16. The method recited in claim 15 further comprising the step of providing a trim DAC to generate a reference voltage for electrical coupling to a second input terminal of said comparator.

17. The method recited in claim 16 further comprising the step of differentially storing an input offset voltage associated with said comparator as a first voltage on said n-bit CDAC and a second voltage on said trim DAC.

18. The method recited in claim 15 further comprising the step of selectively coupling one of said at least two capacitors to said CDAC to provide a most significant bit plate of said CDAC.

19. The method recited in claim 15 wherein said capacitor coupling step comprises the steps of electrically coupling a first one of said at least two capacitors to said first comparator input terminal during a first interval of operation, electrically coupling a second one of said at least two capacitors to said first comparator input terminal during a second interval of operation, and decoupling each of said at least two capacitors from said first comparator input terminal during a third interval of operation.

20. The method recited in claim 15 wherein said sampling step comprises the step of simultaneously sampling said at least two analog signals.

21. The method recited in claim 15 wherein said sampling step comprises the step of sampling said at least two analog signals at a predetermined rate relative to each other.

22. An analog to digital converter comprising:

(a) a dual-channel input stage comprising:

(i) at least two capacitors, each one having a first terminal adapted for electrical coupling to an input port of said converter and a second terminal;

(ii) at least two sample and hold switches, each one having a first terminal electrically coupled to the second terminal of a corresponding one of said at least two capacitors, a second terminal electrically coupled to a fixed voltage, and a control terminal electrically coupled to a control port of said circuit, said control terminal switching said sample and hold switch between a first position in which the second terminal of said corresponding one of said at least two capacitors is electrically coupled to the fixed voltage and a second position in which the second terminal of said corresponding one of said at least two capacitors is not electrically coupled to the fixed voltage; and (iii) a channel selection switch having first and second terminals, each one electrically coupled to the second terminal of a corresponding one of said at least two capacitors, and a third terminal electrically coupled to an output port of said input stage, said channel selection switch controllable to electrically couple one of said at least two capacitors to said output port;

(b) a comparator having a first input terminal electrically coupled to said output port of said input stage and an output terminal at which a comparator output signal is provided; and (c) a successive approximation register electrically coupled to said comparator output terminal for providing a parallel digital output signal having a value related to the voltage level of an analog signal applied to said input port of said converter in response to said comparator output signal.

23. The analog to digital converter recited in claim 22 further comprising a trim DAC providing a reference voltage to a second input terminal of said comparator.

24. The analog to digital converter recited in claim 23 wherein said comparator is operable in an offset voltage reduction mode in which an input offset voltage associated with said comparator is stored on said CDAC and said trim DAC.

25. The analog to digital converter recited in claim 24 wherein said comparator comprises:

a pair of differential input transistors, a first one of said input transistors having a gate terminal providing said first input terminal of said comparator, a source terminal and a drain terminal, a second one of said at least two input transistors having a gate terminal providing said second input terminal of said comparator, a source terminal electrically coupled to the source terminal of said first input transistor and a drain terminal; and a control transistor having a gate terminal receiving a comparator mode control signal, a source terminal electrically coupled to the drain terminal of said first input transistor and a drain terminal electrically coupled to the drain terminal of said second input transistor, wherein said comparator mode control signal is adaptable for being at one of three voltage levels.

26. The analog to digital converter recited in claim 22 further comprising a CDAC electrically coupled to said first comparator input terminal.

27. The analog to digital converter recited in claim 23 wherein said CDAC receives said parallel digital output signal and converts said parallel digital output signal into an analog adjustment signal electrically coupled to said first comparator input terminal.

28. The analog to digital converter recited in claim 22 wherein said dual-channel input stage further comprises at least two CDAC coupling switches, each one having a first terminal electrically coupled to an input port of said converter and a second terminal electrically coupled to the first terminal of a corresponding one of said at least two capacitors.

29. A comparator having a pair of input terminals each adapted for electrical coupling to a respective capacitor, said comparator comprising:

a pair of differential input transistors, each one having a gate terminal providing one of said pair of input terminals of said comparator, a source terminal interconnected with the source terminal of the other one of said pair of input transistors and a drain terminal providing a comparator output node, each gate terminal being electrically coupled to an input offset voltage source;

a comparator mode control transistor having a gate terminal receiving a comparator mode control signal, a source terminal electrically coupled to said drain terminal of a first one of said pair of input transistors and a drain terminal electrically coupled to said drain terminal of a second one of said pair of input transistors, wherein said comparator mode control signal is adapted for being at a first voltage level in which said comparator mode control transistor conducts to electrically couple said drain terminals of said pair of input transistors, a second voltage level in which said comparator mode control transistor is turned off to electrically isolate said drain terminals of said pair of input transistors, and a third, intermediate voltage level in which an input offset voltage associated with said comparator is stored on a respective one of said capacitors.

30. The comparator recited in claim 29 further comprising at least two gain stage transistors, each one having a gate terminal electrically coupled to a corresponding one of said comparator output nodes, wherein an output terminal of said comparator is provided at a drain terminal of a first one of said at least two gain stage transistors.

31. The comparator recited in claim 30 further comprising at least two reset transistors, each one having a gate terminal receiving a reset control signal, a drain terminal electrically coupled to the gate terminal of a respective one of said pair of input transistors and a source terminal electrically coupled to a respective one of said comparator output nodes.

32. A method for generating at least two digital output signals representative of at least two analog input signals comprising the steps of:

receiving at least a first analog signal on a first input port and a second analog signal on a second input port;

charging at least a first capacitor to a first voltage representative of said first analog signal and a second capacitor to a second voltage representative of said second analog signal, said first capacitor having a first terminal electrically coupled to said first input port and second terminal adapted for selective coupling to a first reference voltage and said second capacitor having a first terminal electrically coupled to said second input port and a second terminal adapted for selective coupling to a second reference voltage;

during a first conversion interval, generating in a successive approximation register a first digital signal representative of said first analog signal in response to said first voltage stored on said first capacitor;

during a second conversion interval, generating in said successive approximation register a second digital signal representative of said second analog signal in response to said second voltage stored on said second capacitor.

\* \* \* \* \*